(12) United States Patent
Yonemura et al.

(10) Patent No.: US 10,374,140 B2
(45) Date of Patent: Aug. 6, 2019

(54) PIEZOELECTRIC DEVICE FOR ULTRASONIC SENSOR

(71) Applicant: Seiko Epson Corporation, Tokyo (JP)

(72) Inventors: Takayuki Yonemura, Suwa (JP); Tomohide Onogi, Chino (JP); Chikara Kojima, Matsumoto (JP)

(73) Assignee: Seiko Epson Corporation (JP)

( * ) Notice: Subject to any disclaimer, the term of this patent is extended or adjusted under 35 U.S.C. 154(b) by 269 days.

(21) Appl. No.: 15/379,949

(22) Filed: Dec. 15, 2016

(65) Prior Publication Data

US 2017/0179365 A1    Jun. 22, 2017

(30) Foreign Application Priority Data

Dec. 17, 2015   (JP) ................. 2015-246728

(51) Int. Cl.
*H01L 41/047* (2006.01)
*B06B 1/06* (2006.01)
*H01L 41/09* (2006.01)

(52) U.S. Cl.
CPC ........ *H01L 41/0477* (2013.01); *B06B 1/0622* (2013.01); *B06B 1/0629* (2013.01); *H01L 41/0973* (2013.01)

(58) Field of Classification Search
CPC ............. H01L 41/0477; H01L 41/0973; B06B 1/0622; B06B 1/0629; H03H 9/175
See application file for complete search history.

(56) References Cited

U.S. PATENT DOCUMENTS

| 2007/0284971 | A1* | 12/2007 | Sano ................. H03H 9/02094 310/364 |
| 2013/0223191 | A1* | 8/2013 | Nakamura ............ B06B 1/0629 367/135 |
| 2014/0076842 | A1* | 3/2014 | Takahashi ............... H01L 41/29 216/13 |
| 2014/0267510 | A1* | 9/2014 | Furuya ................. B41J 2/14201 347/71 |
| 2015/0094590 | A1 | 4/2015 | Kiyose et al. |

(Continued)

FOREIGN PATENT DOCUMENTS

| JP | 2001-156351 A | 6/2001 |
| JP | 2006-228783 A | 8/2006 |
| JP | 2006-319945 A | 11/2006 |

(Continued)

*Primary Examiner* — Bryan P Gordon
(74) *Attorney, Agent, or Firm* — Harness, Dickey & Pierce, P.L.C.

(57) ABSTRACT

A piezoelectric device includes a substrate with a cavity, a vibrating plate which is provided on the substrate so as to block an opening surface of the cavity, and a piezoelectric element which is provided on a surface of the vibrating plate opposite to the cavity, including a first electrode, a piezoelectric layer, and a second electrode, in which the second electrode has a laminated structure including a Pt layer (lower layer side electrode) and an Ir layer (upper layer side electrode), in which the Pt layer is in contact with the piezoelectric layer, and in which, if it is assumed that two directions which are parallel to a surface of the substrate and mutually perpendicular are defined as an X direction and a Y direction, the Ir layer is extended to an outside of the cavity at least in the X direction on an X-Y plane view.

3 Claims, 18 Drawing Sheets

(56) References Cited

U.S. PATENT DOCUMENTS

2015/0364670 A1\* 12/2015 Ohta .................. H01L 41/1873
310/360

FOREIGN PATENT DOCUMENTS

| JP | 2007-149858 A | 6/2007 |
|----|---------------|--------|
| JP | 2013-175879 A | 9/2013 |
| JP | 2015-066202 A | 4/2015 |
| JP | 2015-088521 A | 5/2015 |
| JP | 2015-195343 A | 11/2015 |
| JP | 2015-216195 A | 12/2015 |
| JP | 2016-134404 A | 7/2016 |
| WO | WO-2015-141223 A2 | 9/2015 |

\* cited by examiner

C-C'

D-D'

PIEZOELECTRIC DEVICE FOR ULTRASONIC SENSOR

BACKGROUND

1. Technical Field

The present invention relates to a piezoelectric device for an ultrasonic sensor.

2. Related Art

In the related art, an ultrasonic sensor using electromechanical transformation characteristics of a piezoelectric element is provided. In the ultrasonic sensor, an ultrasonic wave (transmitting ultrasonic wave) is transmitted by driving the piezoelectric element by supplying electric signals to the piezoelectric element. In addition, the piezoelectric element receives the ultrasonic wave (reflected ultrasonic wave) which is reflected from a measurement object, thereby driving the piezoelectric element and obtaining the electric signals. In the ultrasonic device equipped with the ultrasonic sensor, information (positions, shapes, or the like) relating to the measuring object is detected based on these electric signals, that is, waveform signals of the transmitting ultrasonic wave or the reflected ultrasonic wave.

This type of the ultrasonic sensor is classified into a transmit-only type ultrasonic sensor optimized for transmitting the ultrasonic wave, a receive-only type ultrasonic sensor optimized for receiving the ultrasonic wave, and a transmission-reception integral-type ultrasonic sensor optimized for both transmitting and receiving the ultrasonic wave. In addition, the ultrasonic sensor is also classified into a type of the ultrasonic sensor in which the piezoelectric element side of a vibrating plate is set to a passing area of the ultrasonic wave (so-called ACT surface type), a type of the ultrasonic sensor in which a side opposite to the piezoelectric element of the vibrating plate is set to the passing area of the ultrasonic wave (so-called CAV surface type), or the like.

Here, in a case where improvement in the receiving properties of the ultrasonic sensor is obtained, from the viewpoint of obtaining high deformation efficiency and excellent ferroelectricity, an increase in the residual amount of polarization can be obtained by suppressing an initial deflection to the CAV surface side of the vibrating plate. That is, it is preferable that the initial deflection of the vibrating plate is set to the ACT surface side instead of the CAV surface side by tensile stress. For example, in JP-A-2013-175879, a CAV surface type ultrasonic sensor in which iridium (Ir) is used for an upper electrode is disclosed. The Ir has characteristics of great tensile stress. By using the characteristics, the initial deflection of the vibrating plate can be set to the ACT surface side instead of the CAV surface side by the tensile stress. However, if the Ir is used as an electrode material, there is a possibility that the residual amount of polarization of the piezoelectric element is reduced, and the receiving properties of the ultrasonic sensor are deteriorated.

It can be also considered that platinum (Pt) which is used as the electrode material in common with the Ir and which can greatly maintain the residual amount of polarization of the piezoelectric element is applied. However, the tensile stress of the Pt is lower than that of the Ir, and the initial deflection to the CAV surface side of the vibrating plate becomes greater. Specifically, the piezoelectric element including a piezoelectric layer which is formed by a chemical solution deposition (CSD) method especially has such tendency.

Accordingly, in a case where the Ir is applied as the electrode material of the ultrasonic sensor, it can be expected that the deformation efficiency is improved by the tensile stress of the Ir. However, since the residual amount of polarization is reduced than a case where the Pt is applied as the electrode material of the ultrasonic sensor, there is a possibility that the receiving properties are deteriorated as a result. On the other hand, in a case where the Pt is applied as the electrode material, since the tensile stress of the Pt is smaller than that of the Ir, it is difficult to obtain high receiving properties.

SUMMARY

An advantage of some aspects of the invention is to provide a piezoelectric device for an ultrasonic sensor which is capable of obtaining improvement in receiving properties.

An aspect of the invention is directed to a piezoelectric device for an ultrasonic sensor including: a substrate with a cavity; a vibrating plate which is provided on the substrate so as to block an opening surface of the cavity; and a piezoelectric element which is provided on a surface of the vibrating plate opposite to the cavity, including a first electrode, a piezoelectric layer which is provided on the first electrode, and a second electrode which is provided on the piezoelectric layer, and in which the second electrode has a laminated structure including a platinum layer and an iridium layer, in which the platinum layer is in contact with the piezoelectric layer, and in which, if it is assumed that two directions which are parallel to a surface of the substrate and mutually perpendicular are defined as an X direction and a Y direction, the iridium layer is extended to an outside of the piezoelectric element and the cavity at least in the X direction on an X-Y plane view.

According to the aspect, it is expected that the residual amount of polarization is increased by contacting the platinum layer to the piezoelectric layer, thereby improving ferroelectricity. In addition, it is possible to improve deformation efficiency by suppressing an initial deflection to the CAV surface side of the vibrating plate by a tensile stress of the iridium layer. Accordingly, it is possible to improve receiving properties of the piezoelectric device for an ultrasonic sensor.

In the piezoelectric device for an ultrasonic sensor, the piezoelectric layer may be present in the cavity, and the platinum layer may be present only on the piezoelectric layer in the X direction.

According to this configuration, when a thermal treatment is performed for forming a good interface in the piezoelectric element, it is possible to prevent the iridium layer at least on a platinum electrode from being separated.

Here, in the piezoelectric device for an ultrasonic sensor, it is preferable that a second iridium layer is extended to the outside of the piezoelectric element and the cavity in a Y direction on the X-Y plane view, and the second iridium layer is separated from the iridium layer, on the piezoelectric layer.

According to this configuration, since the tensile stress of the iridium layer is acted in not only the X direction but also the Y direction, it is possible to more suppress the initial deflection to the CAV surface side of the vibrating plate. Accordingly, the receiving properties of the piezoelectric device for an ultrasonic sensor can be improved.

In the piezoelectric device for an ultrasonic sensor, the piezoelectric layer may be present in the cavity, and the second iridium layer may be extended from a both end portions on the piezoelectric layer to the outside of the cavity in the Y direction, and a second platinum layer which is separated from the platinum layer may be present between the both end portions of the piezoelectric layer and the second iridium layer.

According to this configuration, it is possible to prevent the disconnection between the electrodes by preventing the separation of the second iridium layer after being subjected a thermal treatment (recovery anneal (RA) treatment) of the piezoelectric element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
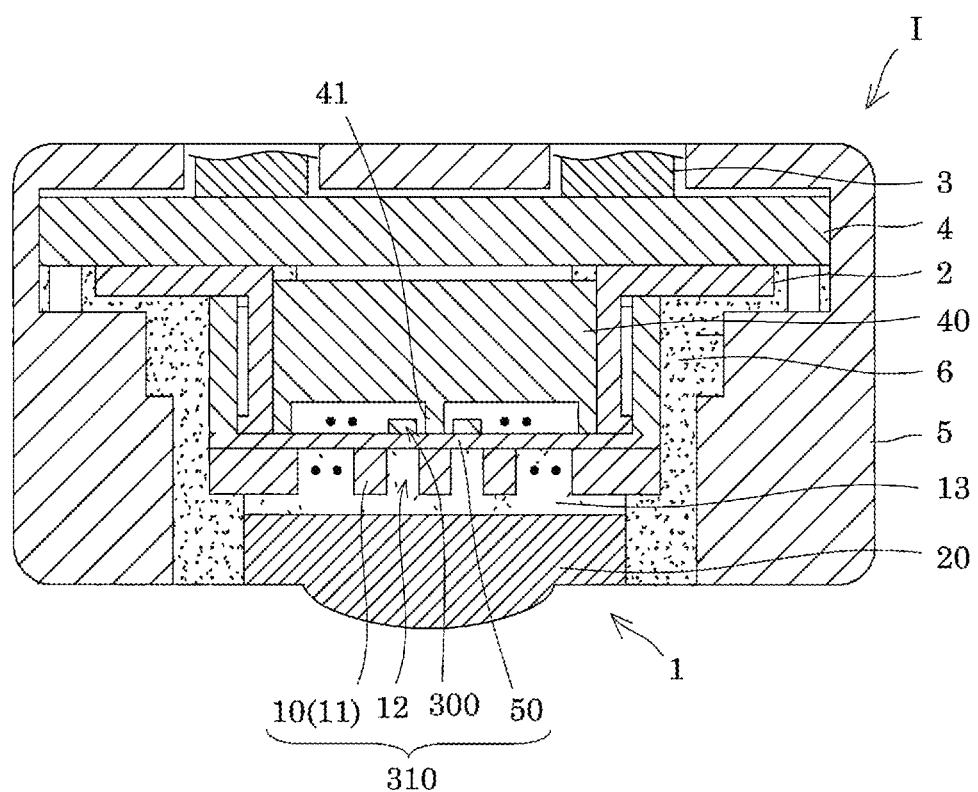
FIG. 1 is a cross-sectional view illustrating a configuration example of an ultrasonic device.

Hereinafter, embodiments of the invention will be described with reference to drawings. The following descriptions are intended to show an aspect of the invention, and can be arbitrarily changed within a range not departing from the gist of the invention. Note that, the same members or parts are denoted by the same numerals in the drawings, and the description thereof will not be repeated appropriately. In addition, in FIGS. 2 to 14, X, Y, and Z indicate three mutually perpendicular spatial axes. In the present specification, each of directions along the axes will be described as a first direction X (X direction), a second direction Y (Y direction), and a third direction Z (Z direction). The X direction and the Y direction indicate in-plane directions of a plate, a layer, and a film, and the Z direction indicates a thickness direction or a lamination direction of the plate, the layer, and the film.

Embodiment 1

Ultrasonic Device

FIG. 1 is a cross-sectional view illustrating a configuration example of an ultrasonic device equipped with an ultrasonic sensor. As illustrated in the drawings, an ultrasonic probe I is configured by equipped with a CAV surface type ultrasonic sensor 1, a flexible printed circuit board (FPC board 2) which is connected to the ultrasonic sensor 1, a cable 3 extracted from a device terminal (not illustrated), a relay substrate 4 for connecting between the FPC board 2 and the cable 3, a housing 5 for covering the ultrasonic sensor 1, the FPC board 2, and the relay substrate 4, a water-resistant resin 6 for filling between the hosing 5 and the ultrasonic sensor 1, or the like.

The ultrasonic waves are transmitted from the ultrasonic sensor 1. In addition, the ultrasonic waves which are reflected from the measurement object are received by the ultrasonic sensor 1. In the device terminal of the ultrasonic probe I, information (position, shape, or the like) relating to the measurement object is detected based on waveform signals of these ultrasonic waves.

According to the ultrasonic sensor 1, the occurrence of distortion in the structure can be suppressed and high reliability can be maintained as described below. Accordingly, by equipping the ultrasonic sensor 1, the ultrasonic device with excellent various characteristics can be obtained. The invention can also be applied to any of the ultrasonic sensor of a transmit-only type ultrasonic sensor optimized for transmitting the ultrasonic wave, a receive-only type ultrasonic sensor optimized for receiving the ultrasonic wave, and a transmission-reception integral-type ultrasonic wave optimized for both transmitting and receiving the ultrasonic wave. The ultrasonic device which can equip the ultrasonic sensor 1 is not limited to the ultrasonic probe I.

Ultrasonic Sensor

Figure 2:
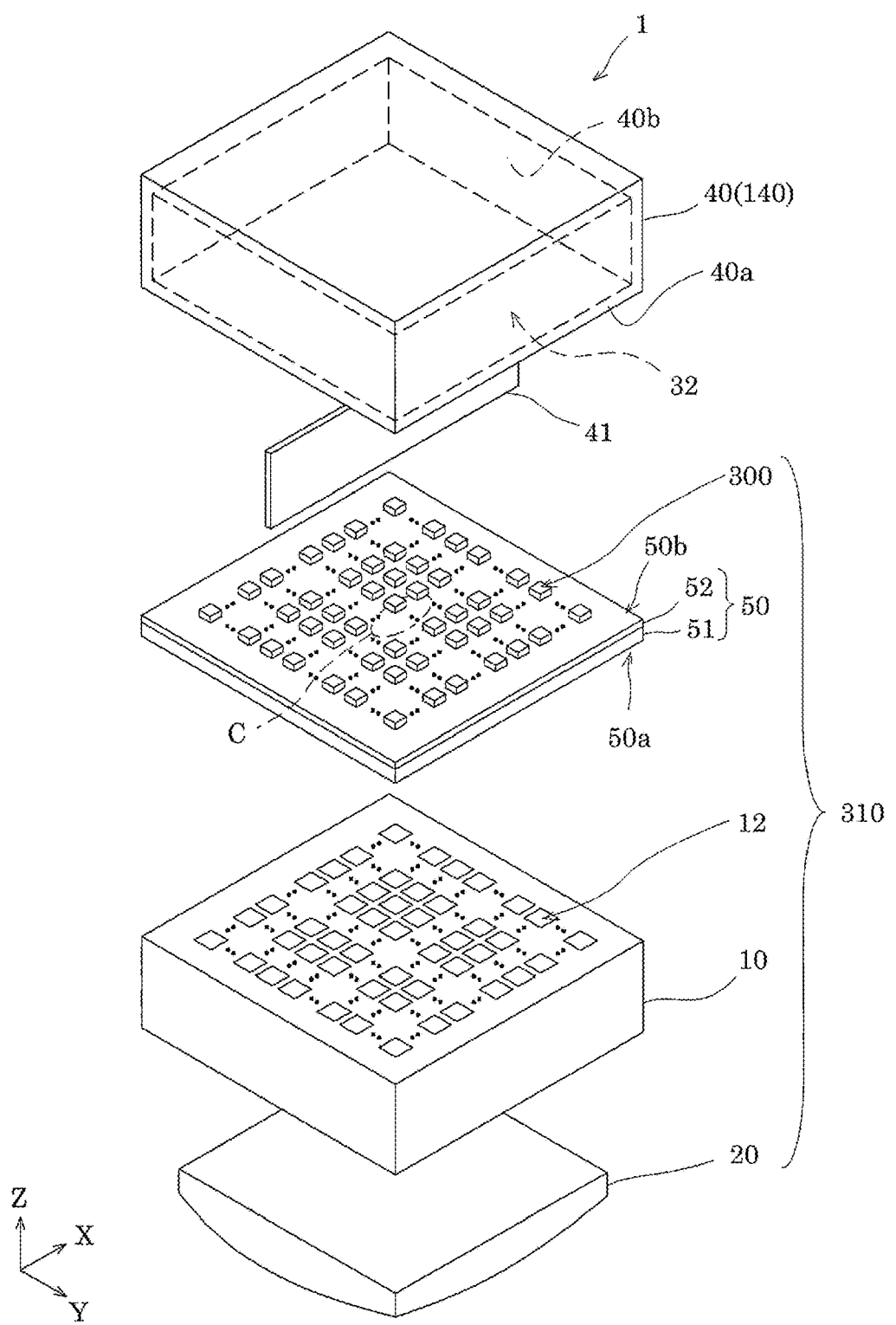
FIG. 2 is an exploded perspective view illustrating a configuration example of an ultrasonic sensor.
Figure 3:
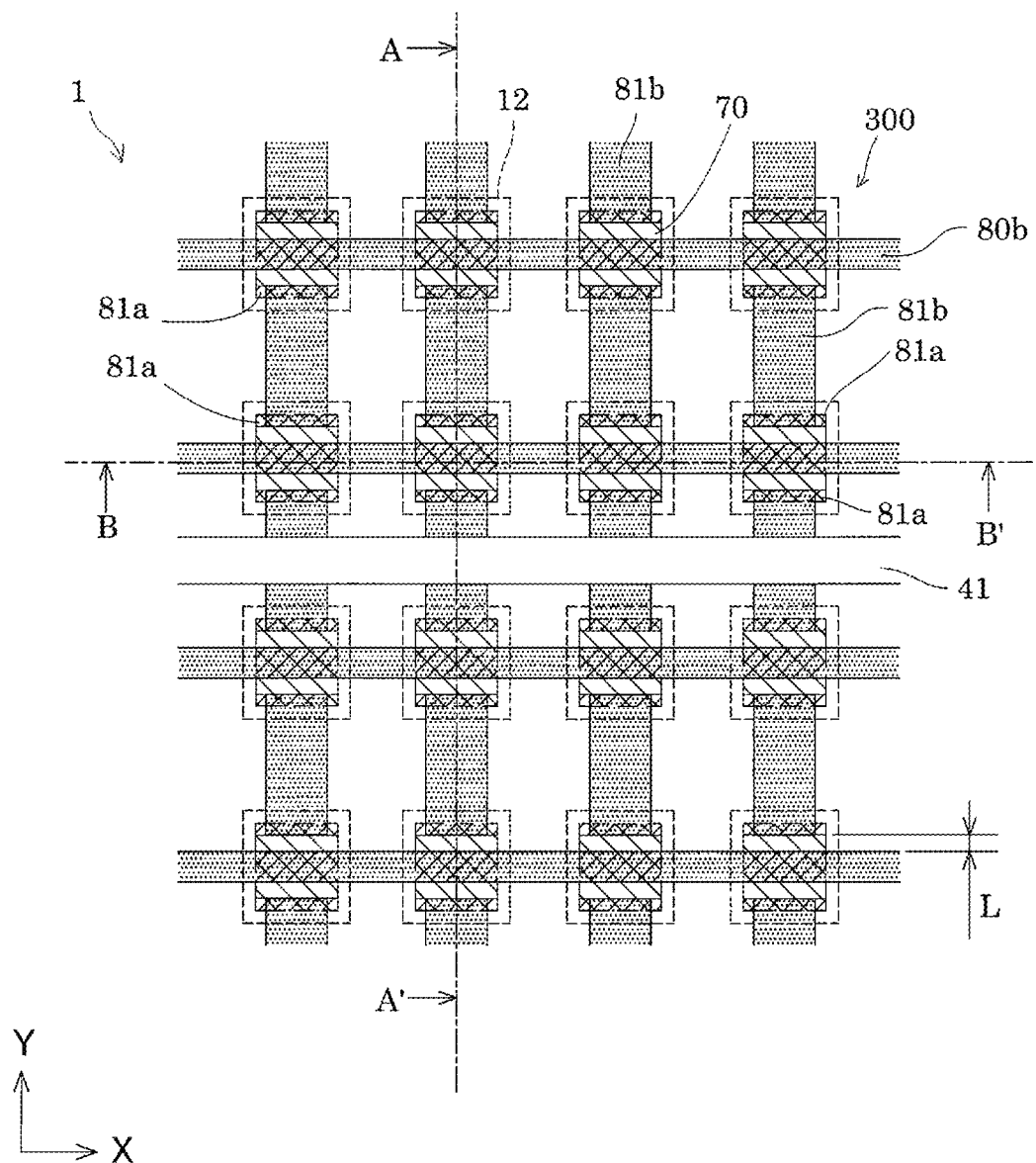
FIG. 3 is a plane view illustrating the configuration example of the ultrasonic sensor.
Figure 4:
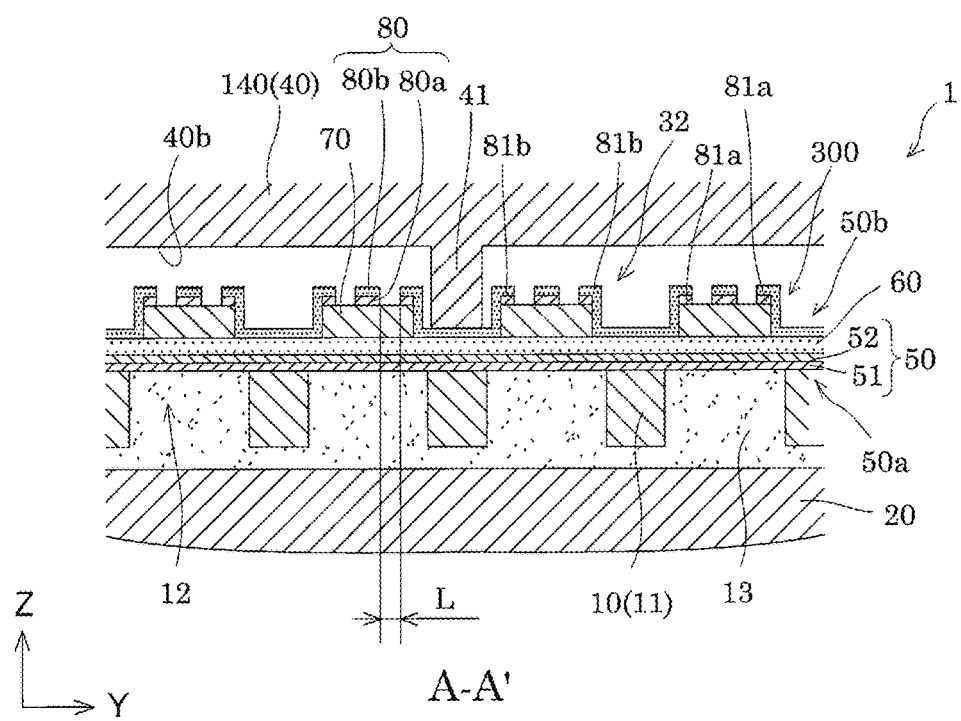
FIG. 4 is a cross-sectional view illustrating the configuration example of the ultrasonic sensor.
Figure 5:
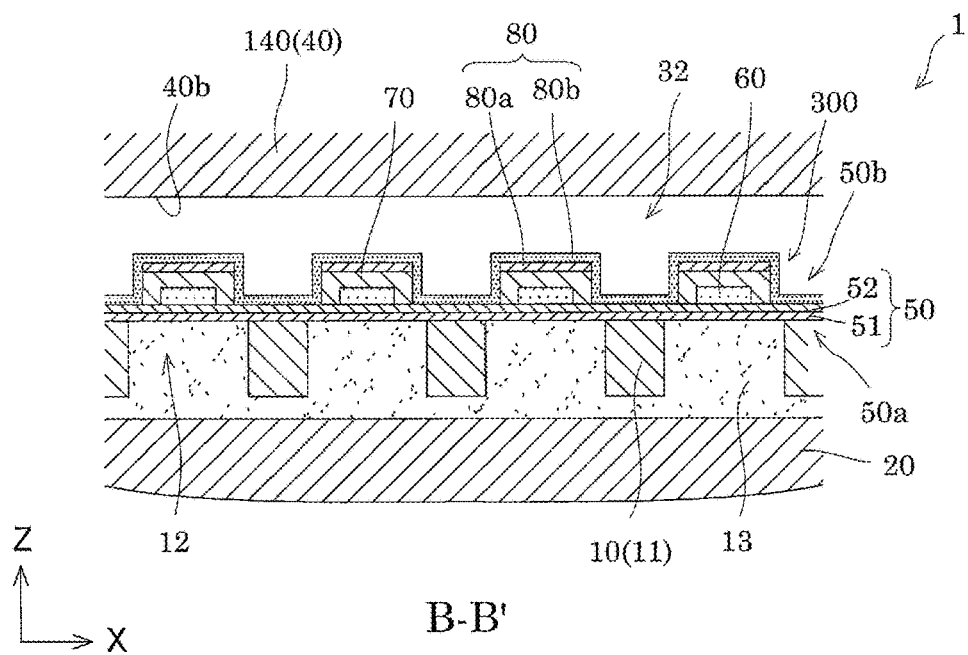
FIG. 5 is a cross-sectional view illustrating the configuration example of the ultrasonic sensor.

Next, a configuration example of the ultrasonic sensor 1 will be described. FIG. 2 is an exploded perspective view illustrating the ultrasonic sensor. FIG. 3 is a plane view illustrating a substrate of the ultrasonic sensor. FIG. 4 is a cross-sectional view taken along the line A-A' in FIG. 3. FIG. 5 is a cross-sectional view taken along the line B-B' in FIG. 3.

As illustrated in FIGS. 1 and 2, the ultrasonic sensor 1 is configured by including an ultrasonic sensor element 310, a sound adjustment layer 13, a lens member 20, and a surrounding plate 40. The ultrasonic sensor element 310 is configured by including a substrate 10, a vibrating plate 50, and a piezoelectric element 300. In the ultrasonic sensor element 310, in addition to the surrounding plate 40, the sound adjustment layer 13 and the lens member 20 are provided, thereby providing the ultrasonic sensor 1. In FIG. 2, the surrounding plate 40 and a supporting member 41 are separately illustrated. However, the both are integrally configured in practice.

A plurality of partitions 11 are formed on the substrate 10. A plurality of spaces 12 are partitioned by the plurality of partitions 11. In the substrate 10, a Si monocrystalline substrate can be used. In the substrate 10, it is not limited to the above-described example, a SOI substrate, a glass substrate, or the like may be used.

The space 12 is formed so as to passing the substrate 10 in the Z direction. A plurality of spaces 12 are formed two dimensionally, that is, are formed in the X direction and are formed in the Y direction. When the X direction is set as a scan direction and the Y direction is set as a slice direction, the ultrasonic sensor 1 transmits and receives the ultrasonic waves for each row extending to the slice direction while scanning in the scan direction. Accordingly, sensing information in the slice direction can be continuously obtained in the scan direction. The space 12 has a square shape when viewed from the Z direction (a length ratio of the X direction to the Y direction is 1:1).

An arrangement or a shape of the space 12 can be variously changed. For example, the plurality of spaces 12 may be formed on dimensionally, that is, may be formed in any one direction of the X direction and the Y direction. In addition, the space 12 may have a rectangular shape when viewed from the Z direction (other than 1:1 of a length ratio of the X direction to the Y direction).

The vibrating plate 50 is provided on the substrate 10 so as to block the space 12. Hereinafter, a surface of the substrate 10 side of the vibrating plate 50 referred to as a first surface 50a and a surface facing the first surface 50a is referred to as a second surface 50b. The vibrating plate 50 is configured of an elastic film 51 formed on the substrate 10 and an insulation layer 52 which is formed on the elastic film 51. In this case, the first surface 50a is configured by the elastic film 51 and the second surface 50b is configured by the insulation layer 52.

The elastic film 51 is formed of silicon dioxide ($SiO_2$) or the like and the insulation layer 52 is formed of zirconium oxide ($ZrO_2$) or the like. The elastic film 51 may not be the different member from the substrate 10. For example, a part of the substrate 10 is processed thin and the resultant may be used as the elastic film 51. A total thickness of the vibrating plate 50 and the substrate 10 is about 50 μm. However, the value is not limited thereto. The total thickness of the vibrating plate 50 and the substrate 10 can be appropriately selected by considering flexibility, a strength or the like.

The piezoelectric element 300 for transmitting and/or receiving the ultrasonic waves is provided on a portion corresponding to the space 12 on the second surface 50b side of the vibrating plate 50. Here, a portion corresponding to the space 12 on the second surface 50b side of the vibrating plate 50 is referred to as a movable portion. The moveable portion is a portion in which vibrating occurs by the deformation of the piezoelectric element 300. The ultrasonic waves are transmitted and/or received from the ultrasonic sensor 1 in accordance with the vibrations occurred in the moveable portion.

The sound adjustment layer 13 is provided in the space 12. By providing the sound adjustment layer 13, it is possible to prevent acoustic impedance from being rapidly changed between the piezoelectric element 300 and the measurement object. As a result, it is possible to prevent propagation efficiency of the ultrasonic wave from being deteriorated. The sound adjustment layer 13 can be configured from a silicone resin, for example. However, it is not limited to the example, and the material in accordance with the purpose of the ultrasonic sensor can be appropriately selected and can be used.

The lens member 20 is provided on the side opposite to the vibrating plate 50 of the substrate 10. The lens member 20 has a function for converging the ultrasonic waves. In a case where the ultrasonic waves are converged by an electronic focusing method, or the like, the lens member 20 can be omitted. Here, the sound adjustment layer 13 has an adhesion function between the lens member 20 and the substrate 10. The ultrasonic sensor 1 is configured by intervening the sound adjustment layer 13 between the lens member 20 and the substrate 10 (partitions 11).

When the lens member 20 is mounted on the ultrasonic sensor element 310 or when adhesiveness of the lens member 20 is maintained after mounting the lens member 20, the lens member 20 is pressed to the sound adjustment layer 13 side, in some cases. Even in a case where the lens member 20 is not equipped or a case where the other member is provided instead of the lens member, in order to maintain the adhesiveness of each portion, the pressing force is applied to the vibrating plate 50 from the sound adjustment layer 13 side in some cases. Since the ultrasonic sensor 1 is configured by providing with the supporting member 41, as described above, it is possible to suppress the structural distortion even when the a predetermined external force is applied to the vibrating plate 50, and thus high reliability can be maintained.

In the CAV type ultrasonic device 1 is configured in which the side opposite to the piezoelectric element 300 of the vibrating plate 50 becomes the passing area of the ultrasonic waves. According to this, since a configuration in which the moisture from the outside is extremely difficult to reach the piezoelectric element 300 can be obtained, the ultrasonic sensor 1 with excellent electrical safety in use is provided. In addition, in a case where the piezoelectric element 300 and the vibrating plate 50 are a thin film, an edge portion 40a of the surrounding plate 40 having a sufficient thickness than the vibrating plate 50 and the supporting member 41 are bonded or adhered to the vibrating plate 50 so as to surround the piezoelectric element 300. Therefore, handling properties during manufacturing can be improved, thereby facilitating the handling of the ultrasonic sensor 1.

As illustrated in FIGS. 3 to 5, the piezoelectric element 300 is configured by including a first electrode layer 60, a piezoelectric layer 70, and a second electrode layer 80. The thickness of each layer is not particularly limited and can be appropriately selected according to the ultrasonic sensor 1 to be applied.

The first electrode layer 60 is extended in the Y direction and the second electrode layer 80 is extended in the X direction over the plurality of piezoelectric elements 300. Accordingly, the piezoelectric element 300 can be selected for each row of the first electrode layer 60 or for each row of the second electrode layer 80 and transmitting and the receiving of the ultrasonic waves are performed for each row extending to the slice direction (Y direction) while scanning in the above-described scan direction (X direction). Here, in the piezoelectric element 300, a portion where the first electrode layer 60 and the second electrode layer 80 are overlapped in the Z direction is referred to as a functional portion. The functional portion is a region to be driven by applying the voltage by the selected first electrode layer 60 and second electrode layer 80, and present within the above-described movable portion.

In addition, in the present embodiment, at least the vibrating plate 50 and the first electrode layer 60 are displaced by the displacing the piezoelectric layer 70. That is, in the present embodiment, at least the vibrating plate 50 and the first electrode layer 60 have a function as a vibrating plate, substantially. However, any one or the both of elastic film 51 and the insulation layer 52 are not provided, and only the first electrode layer 60 may function as the vibrating plate. In a case where the first electrode layer 60 is directly provided on the substrate 10, the first electrode layer 60 is protected by an insulating protection film is preferable.

The piezoelectric layer 70 configuring the piezoelectric element 300 is in the region inner side of the space 12, when viewed from the Z direction. That is, any of the X direction and the Y direction of the piezoelectric layer 70 is shorter than that of the space 12. However, a case where the X direction of the piezoelectric layer 70 is longer than that of the space 12, or a case where the Y direction of the piezoelectric layer 70 is longer than that of the space 12 is included in the invention. The space 12 in which the X direction and the Y direction are appropriately changed based on the X direction and the Y direction of the piezoelectric layer 70 also permitted.

As illustrated in FIGS. 2 to 5, the surrounding plate 40 is provided on the second surface 50b side of the vibrating plate 50. A concave portion (piezoelectric element holding portion 32) is formed at the center of the surrounding plate 40, and around the piezoelectric element holding portion 32 is surrounded by the edge portion 40a and a surface 40b of the surrounding plate 40. A region around the piezoelectric element 300 (region including the top surface and the side surface of the piezoelectric element 300) is covered with the piezoelectric element holding portion 32. Accordingly, the top surface of the piezoelectric element 300 is covered with the surface 40b of the surrounding plate 40, and the side surface is covered with the edge portion 40a.

The surrounding plate 40 is bonded to the ultrasonic sensor element 310 side in the edge portion 40a. For bonding of the surrounding plate 40, an adhesive (not illustrated) can be used. However, it is not limited to the example. The length of the piezoelectric element holding portion 32 in the Z direction is about 80 μm. However, it is not limited to the value. The length of the piezoelectric element holding portion 32 may be a value by which a space which does not inhibit the driving the piezoelectric element 300 is maintained. In addition, the piezoelectric element holding portion 32 may be filled with air and may be filled with a resin. The thickness of the surrounding plate 40 is about 400 μm. However, it is not limited to the value.

In the ultrasonic sensor 1, the supporting member 41 is provided between the surface 40b on the piezoelectric element 300 side of the surrounding plate 40 and the second surface 50b of the vibrating plate 50, and the vibrating plate 50 is supported by the supporting member 41. Accordingly, for example, when the lens member 20 is mounted to the substrate 10 or when adhesiveness of the substrate 10 and the lens member 20 is maintained, the vibrating plate 50 is prevented from being greatly deflected in the piezoelectric element holding portion 32, even when a predetermined pressure is added from the sound adjustment layer 13 side to the vibrating plate 50. Accordingly, the structure distortion can be suppressed, and the high reliability can be maintained.

Furthermore, the supporting member 41 is provided on a position not overlapping the piezoelectric element 300. Therefore, the piezoelectric element 300 is avoided from being excessively restrained by the supporting member 41. Accordingly, as compared to a case where the supporting member 41 is not provided, the transmitting efficiency or receiving efficiency of the ultrasonic waves is prevented from being excessively deteriorated.

A position not overlapping the piezoelectric element 300 is a position not overlapping the above-described functional portion (a portion sandwiched by the first electrode layer 60 and the second electrode layer 80), when viewed from the Z direction. Specifically, in the ultrasonic sensor 1, the supporting member 41 having a width narrower than the partitions 11 is provided between the spaces 12 adjacent in the Y direction. That is, the supporting member 41 is not overlapped to even the above-described moveable member (a portion corresponding to the space 12 on the second surface 50b side of the vibrating plate 50), when viewed from the Z direction. Therefore, as compared to a case where the supporting member 41 is not provided, the transmitting efficiency or receiving efficiency of the ultrasonic waves is reliably prevented from being deteriorated. The supporting member 41 is bonded to the ultrasonic sensor element 310 side by the adhesive (not illustrated). However, the method of the bonding is not limited to the example.

The supporting member 41 has a beam shape extending along the X direction. Therefore, the vibrating plate 50 can be supported in a wider range over the X direction. The beam shaped supporting member 41 may be extended along the Y direction instead of X direction. In the beam shaped supporting member 41, an end portion of extending one side may be separated from the edge portion 40a of the surrounding plate 40. If the end portion of at least one side in the extending direction is in contact with the edge portion 40a of the surrounding plate 40, this structure is included in the beam shaped supporting member 41.

The beam shaped supporting member 41 is manufactured by wet etching the surrounding plate 40. As described above, the supporting member 41 is manufactured by taking advantage of the configuration material of the surrounding plate 40 and has the same configuration as that of the surrounding plate 40. In the wet etching, processing accuracy is deteriorated as compared to a dray etching, but a lot of the region can be eliminated at a short time, therefore the wet etching is an appropriate method for manufacturing the beam shaped supporting member 41.

The center portion of the piezoelectric element holding portion 32 is comparatively separated from the edge portion 40a of the surrounding plate 40. Accordingly, in the vibrating plate 50, a center location C corresponding to the center portion of the piezoelectric element holding portion 32, rigidity is easily lowered in a case where the supporting member 41 is not provided. The supporting member 41 is provided at the center portion of the piezoelectric element holding portion 32 so as to support the center location C of the vibrating plate 50. Accordingly, higher reliability can be maintained.

In the invention, the number, the arrangement, the shape, or the like of the supporting members 41 can be variously selected. For example, the number of the supporting members 41 may be plural. In this case, it is preferable that the supporting member 41 is provided at an equal interval in the piezoelectric element holding portion 32. According to this, the vibrating plate 50 can be uniformly supported. Accordingly, it is preferable that the number of the vibrating plates 50 is an odd number equal to or greater than three. The reason is that when the supporting member 41 is provided at the equal interval in the piezoelectric element holding port ion 32, the center supporting member 41 is positioned adjacent to the center location C of the vibrating plate 50. For example, when the number of the supporting members 41 is about 3, the balance is good.

The supporting member 41 may not have a beam shape. The supporting member 41 may be provided only on a portion shifting from the center location C of the vibrating plate 50. The supporting member 41 may not be a linear shape in the extending direction. Depending on the manufacturing method of the supporting member 41, there is a case the cross-section area of the supporting member 41 in the X-Y plane is different according to the Z direction.

The piezoelectric layer 70 is configured by patterning for each space 12, and pinched by the first electrode layer 60 and the second electrode layer 80. The piezoelectric layer 70 is configured by including a complex oxide having an $ABO_3$ type perovskite structure, for example. An A site having the $ABO_3$ type perovskite structure forms to have oxygen 12-coordinated, and a B site having oxygen 6-coordinated and the sites form an octahedron.

As the complex oxide configuring the piezoelectric layer 70, a PZT based complex oxide in which the piezoelectric properties are comparatively high, and lead (Pb), zirconium (Zr), and titanium (Ti) are included. By using the PZT based complex oxide, improvement in the displacement of the piezoelectric element 300 can be easily obtained. In addition, in addition to this, a PMN-PT based complex oxide including lead, magnesium (Mg), niobium (Nb), and titanium can also be applied.

In addition, as the complex oxide configuring the piezoelectric layer 70, a non-lead based material with reduced content of the lead can be used. As the non-lead based material, for example, a BFO complex oxide including bismuth (Bi) and iron (Fe), a BF-BT based complex oxide including bismuth, barium (Ba), iron, and titanium, a BFM-BT based complex oxide including bismuth, iron, manganese (Mn), barium, and titanium, a KNN based complex oxide including potassium (K), sodium (Na), and niobium, or the like is included. By using the non-lead based material, since the content of the lead of the piezoelectric layer 70 can be suppressed, the ultrasonic sensor 1 by which the load to the environment is small can be configured.

In these complex oxides, the other elements may be included. As the other element, lithium (Li), bismuth, barium, calcium (Ca), strontium (Sr), samarium (Sm), Cerium (Ce), or the like to be substituted to a part of the A site of the piezoelectric layer 70, or manganese, zinc (Zn), zirconium, magnesium, copper (Cu), aluminum (Al), nickel (Ni), cobalt (Co), chromium (Cr), titanium, zirconium, or the like to be substituted to a part of the B site of the piezoelectric layer 70 is included.

The complex oxide having the $ABO_3$ type perovskite structure includes a complex oxide shifted from a stoicheiometric composition due to a deficiency or excess or a complex oxide in which a part of the element is substituted to the other element. That is, as long as a complex oxide has the perovskite structure, shifting of inevitable composition due to lattice mismatch, oxygen deficiency, or the like, and also a part of the element substitution or the like are acceptable.

The piezoelectric layer 70 may have a laminate structure formed from the plurality of complex oxide or the other materials. For example, an adhesion layer such as a Ti layer is provided on an uppermost layer and a lowermost layer, and it may be used as the piezoelectric layer 70. Alternatively, each of an underlayer and a main layer which are formed of the complex oxide is provided, and for example, a control layer for improving orientation of the crystal may be provided between these layers. Such a control layer can be configured from a titan oxide ($TiO_x$) layer or the like, for example. Of course, each of adhesion layers may be provided on the uppermost layer and the lowermost layer of the underlayer or the main layer.

The material of the first electrode layer 60 is not limited as long as it has the conductivity. As the material of the first electrode layer 60, a metal material, a tin-based conductive material oxide, a zinc oxide-based conductive material, an oxide conductive material, or the like is included. As the metal material, platinum (Pt), iridium (Ir), gold (Au), aluminum (Al), copper (Cu), titanium (Ti), stainless steel, or the like is included. The tin-based conductive material oxide is an indium tin oxide (ITO), a fluorine-doped tin oxide (FTC), or the like. The oxide-based conductive material is a zinc oxide-based conductive material, a strontium ruthenium oxide ($SrRuO_3$), a nickel lanthanum ($LaNiO_3$), an element-doped strontium titanate, or the like. The material of the first electrode layer 60 may be a conductive polymer. In addition, the first electrode layer 60 may have a laminate structure formed from a plurality of materials. For example, an adhesion layer such as a Ti layer is provided to an uppermost layer and a lowermost layer, and it may be used as the first electrode layer 60. In a case where the adhesion layer is provided to the lowermost layer which is provided between the piezoelectric element 300 and the vibrating plate 50, the material thereof is not limited thereto, a material such as titanium oxide ($TiO_x$) or silicon nitride (SiN) may be used.

In the invention, the second electrode layer 80 has a laminate structure including a lower layer side electrode 80a formed of platinum (Pt) and an upper layer side electrode 80b which is formed of iridium (Ir). That is, the lower layer side electrode 80a formed of the Pt is in contact with the piezoelectric layer 70. Accordingly, a residual amount of polarization of the piezoelectric layer 70 is increased, and it is expected that the ferroelectricity is improved. As a result, the ultrasonic sensor 1 in which the piezoelectric element 300 in which the lower layer side electrode 80a formed of the Pt is in contact with the piezoelectric layer 70 is applied can obtain the good receiving properties.

Here, the lower layer side electrode 80a is present on the piezoelectric layer 70 (refer to FIG. 5), the upper layer side electrodes 80b cover the side surface of the piezoelectric layer 70 from the top of the lower layer side electrode 80a, are continuously provided on the insulation layer 52 configuring the vibrating plate 50 between the piezoelectric layers 70, and are extended in the X direction (refer to FIG. 5). The lower layer side electrodes 80a may be continuously provided in the X direction.

In addition, as illustrated in FIG. 4, the lower layer side electrode 80a and the upper layer side electrode 80b are provided only on the center portion of the piezoelectric layer 70 in the Y direction. That is, the upper layer side electrode 80b on the piezoelectric layer 70 is formed through the lower layer side electrode 80a.

Accordingly, although details will be described later, when a thermal treatment for forming the good interface in the piezoelectric element 300 is performed, it is possible to prevent the upper layer side electrode 80b which is formed of the Ir on at least the lower layer side electrode 80a which is formed of the Pt from being separated.

Furthermore, on the both end portions of each piezoelectric layer 70 in the Y direction, a Pt layer 81a and an Ir layer 81b which are configured at the same layer as that of the lower layer side electrode 80a and the upper layer side electrode 80b are provided, and only the Ir layer 81b is extended on the first electrode layer 60 between the piezoelectric layers 70 by covering the side surface of the piezoelectric layer 70, and extended to the end portion of the adjacent piezoelectric layer 70.

Such the Pt layer 81a and the Ir layer 81b are formed at the same time of the lower layer side electrode 80a and the upper layer side electrode 80b, and are separated by the patterning. That is, by patterning, the Pt layer 81a and the Ir layer 81b are separated from the both side end portions of the lower layer side electrode 80a and the upper layer side electrode 80b in the Y direction at a distance L. The distance L is about 5 µm. However, it is not limited thereto. The Ir layer 81b may not always be provided.

That is, as illustrated in FIG. 3, in the second electrode layer 80, at least the upper layer side electrode 80b which is formed of the Ir is configured by patterning to a shape which is extended to the outside of the piezoelectric element 300 and the space 12 (cavity) at least in the X direction. According to the configuration, deformation efficiency can be improved by suppressing the initial deflection to the CAV surface side of the vibrating plate 50 due to the tensile stress of the upper layer side electrode 80b formed of the Ir, and the ultrasonic sensor 1 to which the piezoelectric element 300 is applied can obtain the excellent receiving properties.

In addition, from the viewpoint of the further improvement in the deformation efficiency, the Ir layer 81b is extended to the outside of the piezoelectric element 300 and the space 12 in the Y direction, and on the piezoelectric layer 70, it is preferable that a part thereof is configured by patterning into a shape separated from the upper layer side electrode 80b. That is, a tensile stress of the Ir layer 81b which is extended to the outside of the piezoelectric element 300 and the space 12 in the Y direction is added to the tensile stress of the upper layer side electrode 80b which is extended to the outside of the piezoelectric element 300 and the space 12 in the X direction. According to the configuration, since the tensile stress of the Ir is also acted on not only the X direction, but also the Y direction with respect to the piezoelectric element 300, the initial deflection to the CAV surface side of the vibrating plate 50 can further be suppressed.

As described above, the Pt layer 81a which is separated from the lower layer side electrode 80a is present between the both end portions of the piezoelectric layer 70 and the Ir layer 81b. According to the configuration, it is possible to prevent the disconnection between the electrodes by preventing the separation of the Ir layer 81b after being subjected a thermal treatment (recovery anneal (RA) treatment) of the piezoelectric element 300 to be described.

The other layer which is formed of the above-described material including conductivity may be provided between the layers of the lower layer side electrode 80a and the upper layer side electrode 80b. In a case of forming the upper layer side electrode 80b having the laminate structure, in the same manner as that of the above-described first electrode layer 60, the adhesion layer such as a Ti layer is provided on an uppermost layer and a lowermost layer, and it may be used as the upper layer side electrode 80b. The adhesion layer which is provided on the uppermost layer of the upper layer side electrode 80b is provided for overlapping lead wirings by gold (Au), silver (Ag), copper (Cu), nickel (Ni), nickel-chromium (Ni—Cr), titanium-tungsten (Ti—W), or the like. In addition, in a case where the wiring is formed by plating, a seed layer such as palladium (Pd) may be formed instead of the adhesion layer. Alternatively, a protecting film such as an aluminum oxide ($Al_2O_3$), a tantalum oxide ($Ta_2O_5$), a silicon dioxide ($SiO_2$), or the like may be provided.

In the present embodiment, from the viewpoint of a RA treatment to be described, it is preferable that the other layer is not intervened between the piezoelectric layer 70 and the second electrode layer 80. However, if it is the degree not affect to the RA treatment, it is permitted that the other layer is partially intervened. As the other layer, a metal layer such as gold (Au), silver (Ag), titanium (Ti), copper (Cu), or nickel (Ni); an alloy layer such as nickel-chromium (Ni—Cr) or titanium-tungsten (Ti—W); and a conductive oxide layer such as nickel lanthanum ($LaNiO_3$; LNO) or ruthenium acid strontium ($SrRuO_3$; SRO) are included.

Manufacturing Method

Figure 6:
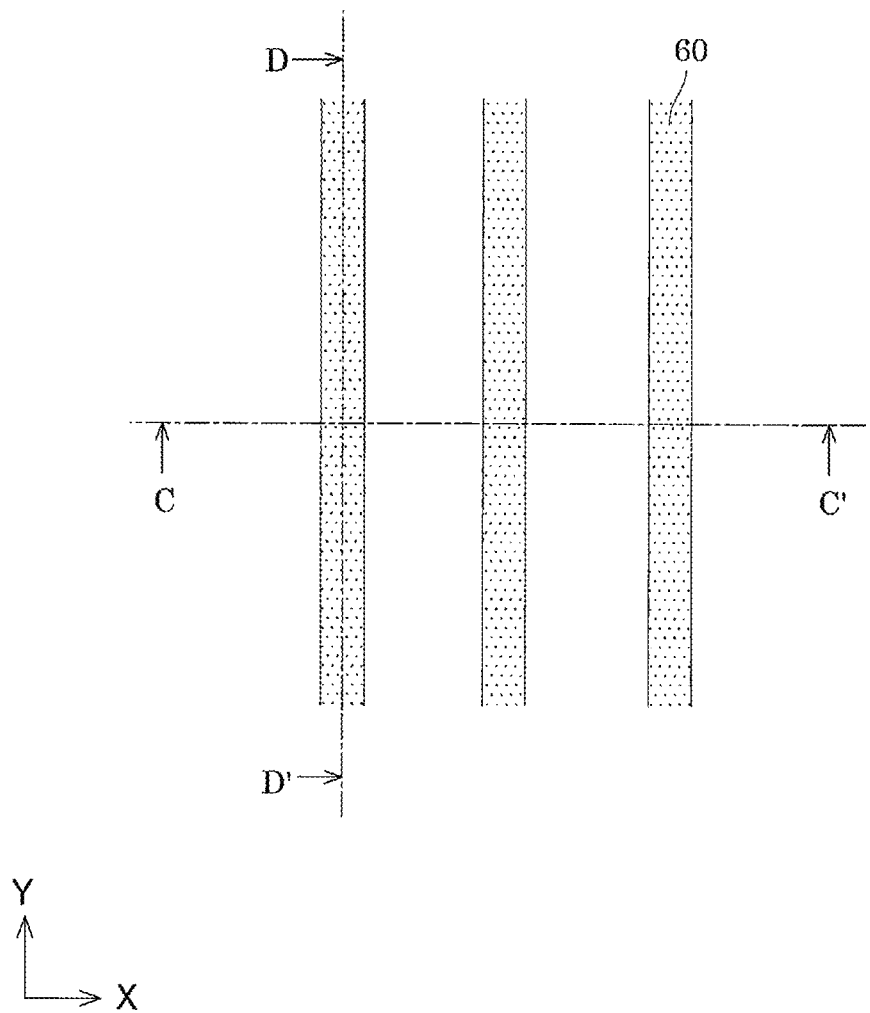
FIG. 6 is a plane view illustrating the manufacturing example of the ultrasonic sensor.
Figure 7:
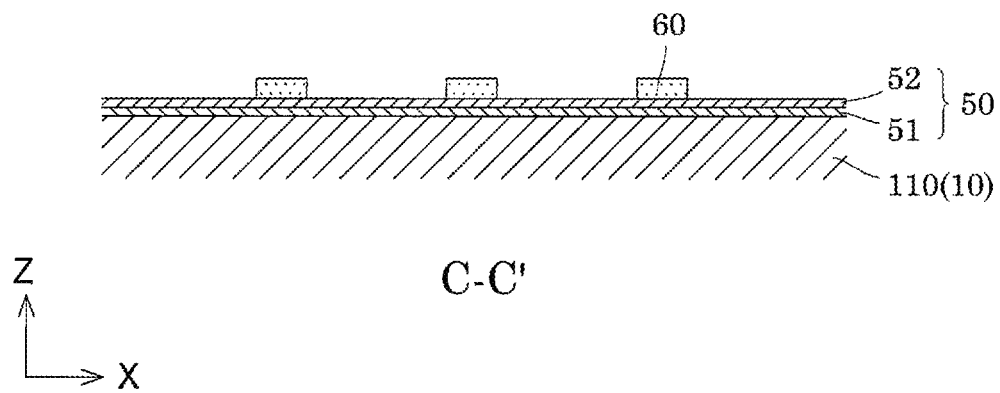
FIG. 7 is a cross-sectional view illustrating the manufacturing example of the ultrasonic sensor.
Figure 8:
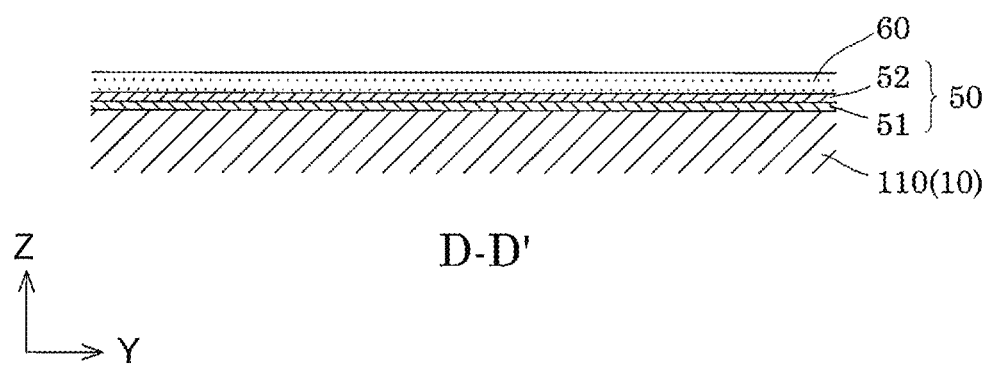
FIG. 8 is a cross-sectional view illustrating the manufacturing example of the ultrasonic sensor.
Figure 9:
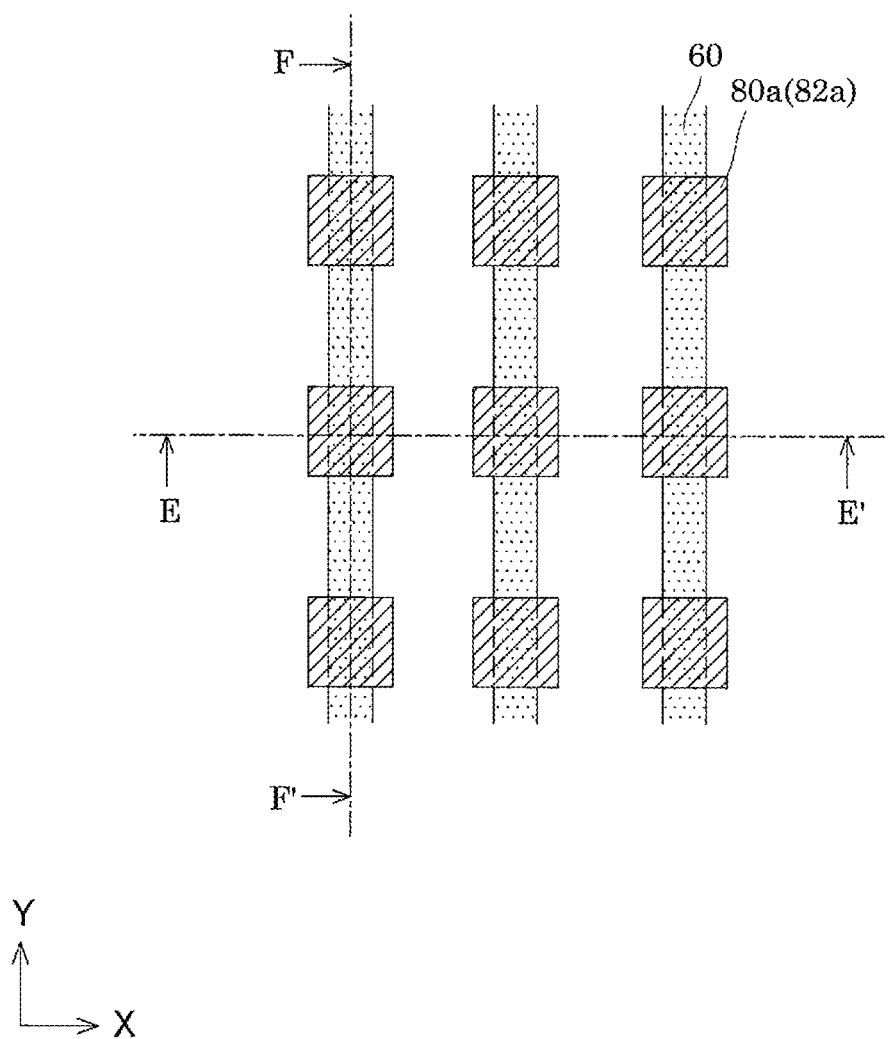
FIG. 9 is a plane view illustrating the manufacturing example of the ultrasonic sensor.
Figure 10:
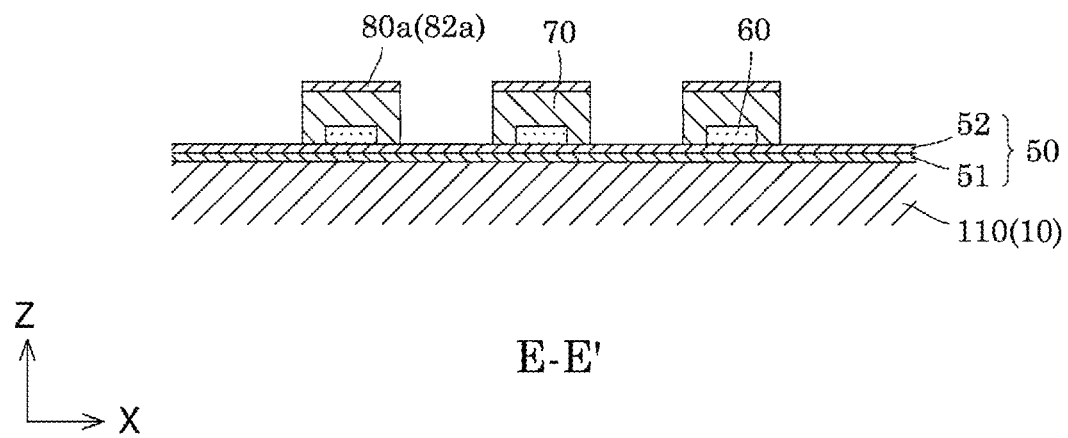
FIG. 10 is a cross-sectional view illustrating the manufacturing example of the ultrasonic sensor.
Figure 11:
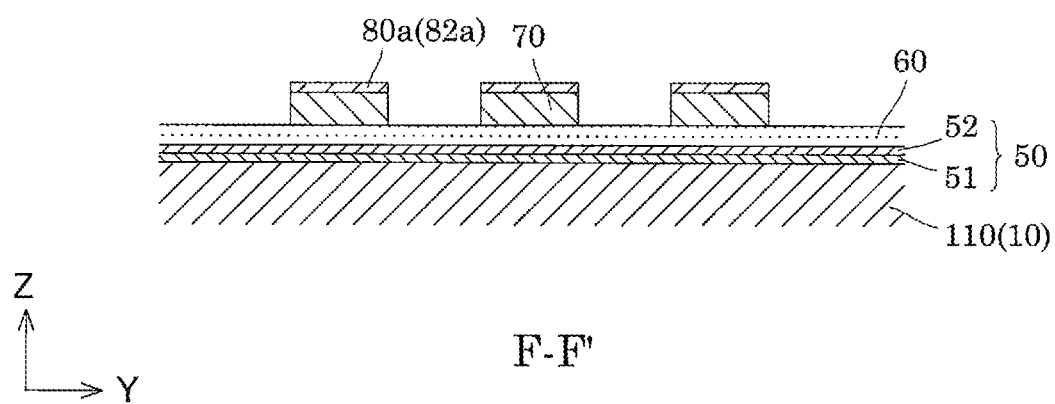
FIG. 11 is a cross-sectional view illustrating the manufacturing example of the ultrasonic sensor.
Figure 12:
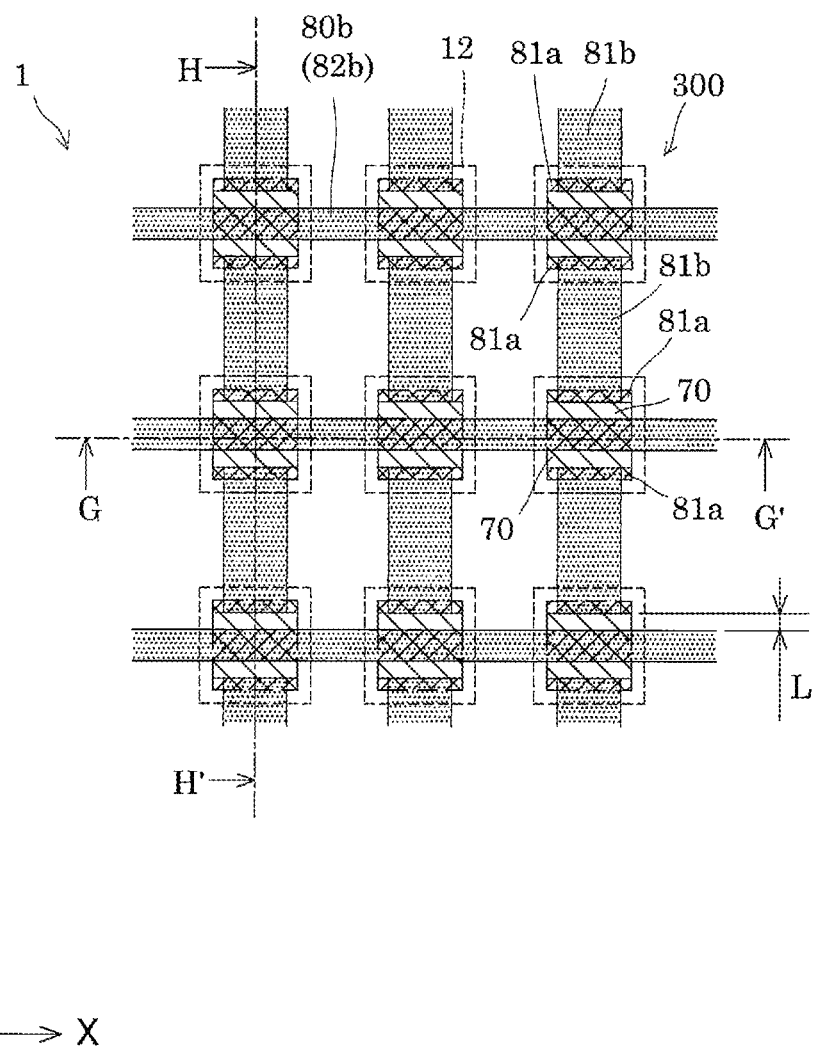
FIG. 12 is a plane view illustrating the manufacturing example of the ultrasonic sensor.
Figure 13:
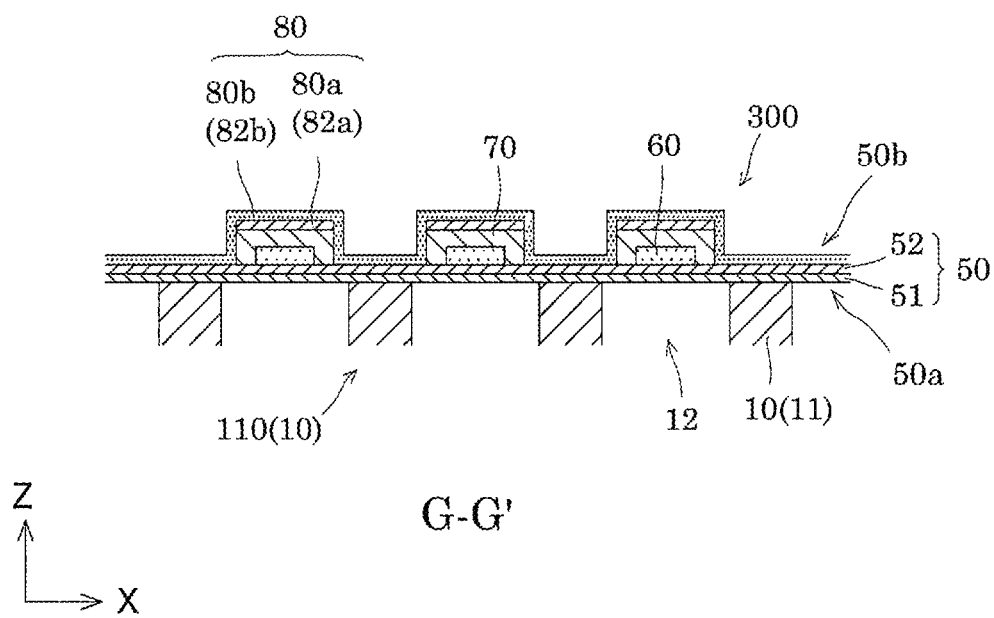
FIG. 13 is a cross-sectional view illustrating the manufacturing example of the ultrasonic sensor.
Figure 14:
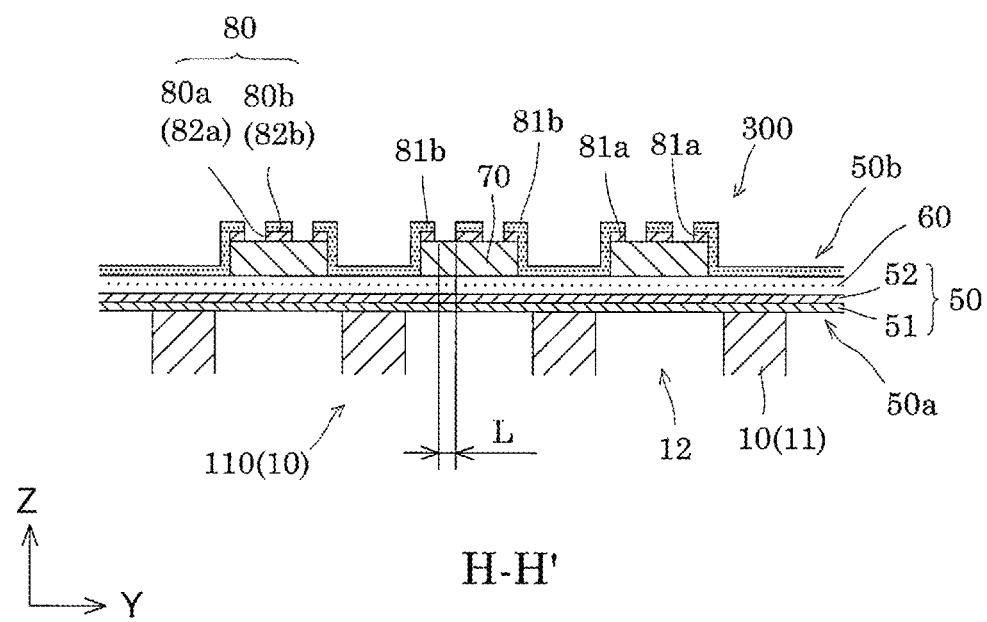
FIG. 14 is a cross-sectional view illustrating the manufacturing example of the ultrasonic sensor.

Next, an example of the manufacturing method of the ultrasonic sensor 1 will be described. FIGS. 6 to 14 mainly illustrate a process of a manufacturing method of a side on the ultrasonic sensor element. FIGS. 6, 9, and 12 are plane views of the ultrasonic sensor element when viewed from the Z direction. FIG. 7 is a cross-sectional view taken along the line C-C' in FIG. 6, and FIG. 8 is a cross-section view taken along the line D-D' in FIG. 6. FIG. 10 is a cross-section view taken along the line E-E' in FIG. 9, and FIG. 11 is a cross-section view taken along the line F-F' in FIG. 9. FIG. 13 is a cross-section view taken along the line G-G' in FIG. 12, and FIG. 14 is a cross-section view taken along the line H-H' in FIG. 12.

Firstly, as illustrated in FIGS. 6 to 8, the elastic film 51 which is formed of silicon dioxide ($SiO_2$) is formed on the surface of the silicon made substrate 10 (hereinafter, referred to as a "wafer 110") by the thermal oxidation or the like. Thereafter, a film of zirconium (Zr) is formed on the elastic film 51 by a sputtering method, the insulation layer 52 which is formed of zirconium oxide ($ZrO_2$) is formed by the thermal oxidation, and the resultant is set as the vibrating plate 50. The first electrode layer 60 is formed on the insulation layer 52 by the sputtering method or an evaporation method. At this time, the first electrode layer 60 having a laminate structure formed from the same type of the electrode layers or the different type of the electrode layers may be formed.

Next, as illustrated in FIGS. 9 to 11, the piezoelectric layer 70 is formed on the first electrode layer 60 and the formed piezoelectric layers 70 are subjected to the patterning into a predetermined shape. For example, the piezoelectric layer 70 is formed by using a chemical solution deposition (CSD) method in which a metallic complex is coated with a solution which is dissolved and dispersed to a solvent and is dried, and further burned at a high temperature to obtain a piezoelectrode material which is formed of a metal oxide. The method is not limited to the CSD method, and a sol-gel method, a laser ablation method, a sputtering method, a pulse laser deposition method (PLD method), a CVD method, an aerosol deposition method, or the like may be used.

The detailed forming procedure example in a case where the piezoelectric layer 70 is formed by the CSD method is as follows. That is, a precursor solution which is formed of a metal-organic decomposition (MOD) solution or sol including the metallic complex and is used for forming the piezoelectric layer 70 is prepared. The precursor solution is applied onto the first electrode layer 60 by using a spin coating method to form a precursor film (not illustrated) (coating process). The precursor film is heated at a predetermined temperature and dried for the certain time (drying process), is further heated the dried precursor film at the predetermined temperature, and is delipidated by maintaining for the certain time (degreasing process). The precursor film is crystallized by heating and maintaining the precursor film and to form the piezoelectric layer 70 (burning process). The piezoelectric layer 70 formed by the CSD method has a plurality of piezoelectric films which are formed by a series of process from the coating process to the burning process. That is, the piezoelectric layer 70 is formed by repeating the series of process from the coating process to the burning process in plural times. In the series of process from the coating process to the burning process, after repeating the processes from the coating process to the degreasing process in plural times, the burning process may be performed.

A layer or the film formed by the CSD method has an interface. In the layer or the film formed by the CSD method, remains of the coating or the burning are remained, and such the remains becomes a confirmable "interface" by observing the cross-section or analyzing the concentration distribution of the element in the layer (or in the film). The "interface" strictly means a boundary between the layers or the films, and in here, means adjacent to the boundary between the layers or the films. In a case of observing the cross-section of the layer or the film formed by a wet method, such an interface is confirmed as a portion having a dark color than the other portion, or a portion having a thin color than the other portion in the vicinity of the boundary to an adjacent layer or film. In addition, in a case where the concentration distribution of the element is analyzed, the interface is confirmed as the portion having a high concentration of the element other than the portion or the portion having a low concentration of the element than the other portion. Since the piezoelectric layer 70 is formed by repeating the coating process or the burning process in plural times (configured by the plurality of piezoelectric film), by corresponding to each piezoelectric film, the piezoelectric layer 70 has a plurality of interfaces.

In the process, the piezoelectric layer 70 having the laminate structure formed from the same types of the electrode layers or the different types of the electrode layers can be formed. For example, from the viewpoint of obtaining the high orientation, the piezoelectric layer 70 may be manufactured by forming the control layer on the underlayer of the piezoelectric body, and further forming a main layer of the piezoelectric body. Each adhesion layer may be provided on the lowermost layer and the uppermost layer of the piezoelectric layer 70, respectively.

Next, Pt layers 82a configuring the lower layer side electrode 80a are formed on the vibrating plate 50 and the piezoelectric layer 70, and after subjecting the formed layer to a thermal treatment (recovery anneal (RA) treatment), the piezoelectric layer 70 and the Pt layer 82a are patterned for each of the piezoelectric element 300 (refer to FIG. 3). The Pt layer 82a is formed by the sputtering method or evaporation method. In addition, in the RA treatment, a rapid thermal annealing (RTA) device for heating by radiation of an infrared lamp is used. Here, the Pt layer 82a is formed by an electrode material which does not generate the oxide by the thermal treatment and with high chemical stability, that is, platinum (Pt). Therefore, an electric resistivity due to the RA treatment is prevented from being increased and the good interface between the upper layer side electrode 80b to be described (refer to FIGS. 13 and 14) can be formed.

In addition, in the lower layer side electrode 80a formed of the Pt layer 82a, since the electrical properties are not impaired by the RA treatment, the residual amount of polarization of the piezoelectric layer 70 is increased and the ferroelectricity is improved. As a result, in a case where the piezoelectric element 300 in which the lower layer side electrode 80a formed of the Pt layer 82a is in contact with the piezoelectric layer 70 is applied to the ultrasonic sensor 1, the excellent receiving properties can be obtained.

Next, as illustrated in FIGS. 12 to 14, a Ir layer 82b configuring the upper layer side electrode 80b is formed on the vibrating plate 50, the first electrode layer 60, and the lower layer side electrode 80a by the sputtering method or the evaporation method. Thereafter, the Ir layer 82b is patterned into a shape that the layer is extended to the outside of the piezoelectric element 300 and the space 12 (cavity) in the X direction, and the patterned shaped is set as the upper layer side electrode 80b. In addition, as illustrated in FIG. 14, on the piezoelectric layer 70, the upper layer side electrode 80b is separated in the Y direction, the side surface of the piezoelectric layer 70 is covered from the both end portions of the piezoelectric layer 70, and the Ir layer 81b which is extended between the piezoelectric layers 70 is patterned. In a portion of a distance L between the second electrode layer 80, the Pt layer 81a, and the Ir layer 81b, the Pt layer 82a is cut, and the Pt layer 81a is remained on the both end portions of the piezoelectric layer 70.

Here, the upper layer side electrode 80b is formed by an electrode material with low electrical resistivity having a tensile stress for improving the receiving properties, that is, iridium (Ir). For example, in the Ir, iridium oxide ($IrO_2$) is generated by the RA treatment and the electric resistivity is improved. The adhesiveness in the Pt interface that is the lower layer side electrode 80a is deteriorated. Therefore, peeling of the electrode is generated. However, these problems can be solved performing the RA treatment before the formation of the upper layer side electrode 80b that is after the formation of the lower layer side electrode 80a.

In addition, since the Ir layer 81b is provided on the end portion of the other piezoelectric layer 70 from one piezoelectric layer 70 in the Y direction, it is possible to improve the deformation efficiency by suppressing the initial deflection to the CAV surface side of the vibrating plate 50 by the Ir layer 81b. As a result, by adopting the piezoelectric element 300 having the configuration to the ultrasonic sensor 1, it is possible to obtain the excellent receiving properties.

Furthermore, as illustrated in FIGS. 13 and 14, a resist (not illustrated) is provided on the surface opposite to the piezoelectric element 300 of the wafer 110, and the resist is subjected to patterning into a predetermined shape to form a mask film (not illustrated). The wafer 110 is subjected to anisotropic etching (wet etching) using an alkaline solution such as potassium hydroxide (KOH) through the mask film. According to this, the space 12 is formed in a region opposite the piezoelectric element 300 of the substrate 10 (wafer 110).

In addition, a resist (not illustrated) is provided on the surface of a wafer 140 (surrounding plate 40), and the resist is subjected to patterning into a predetermined shape to form a mask film (not illustrated). Here, as illustrated in FIG. 2, a mask film (not illustrated) is formed on the edge portion 40a of the wafer 140 and mask films (not illustrated) which are continuously extended from the mask film along the X direction is formed. The wafer 140 is subjected to anisotropic etching (wet etching) using an alkaline solution such as potassium hydroxide (KOH) through the mask film. Accordingly, the surrounding plate 40 in which the supporting member 41 and the piezoelectric element holding portion 32 are formed is manufactured. In the wet etching, processing accuracy is deteriorated as compared to a dray etching, and a lot of the region can be eliminated at a short time.

Thereafter, the portions are sequentially provided, and the ultrasonic sensor 1 illustrated in FIG. 2 is manufactured. That is, the surrounding plate 40 and the supporting member 41 are bonded to the ultrasonic sensor element 310 with an adhesive (not illustrated) such that the supporting member 41 is not overlapped with the piezoelectric element 300. By providing the sound adjustment layer 13 in the space 12, the lens member 20 is bonded thereto. After bonding the sound adjustment layer 13 and the lens member 20, the surrounding plate 40 and the supporting member 41 may be bonded to the ultrasonic sensor element 310.

EXAMPLES

Hereinafter, examples will be described and the invention will further be described in detail. The invention is not limited to the following examples.

Example 1

Preparation of PZT Precursor Solution

A PZT precursor solution was manufactured such that an acetic acid and water are weighed to a container, and lead acetate, zirconium butoxide, titanium tetra-i-propoxide, and polyethylene glycol were weighed, and these materials were heated for 90° C. and stirred.

Manufacturing of Vibrating Plate

By thermally oxidizing a silicon substrate (wafer 110) having a size of 6 inch, a silicon dioxide film (elastic film 51) was formed on the substrate. Next, the zirconium film was formed by the sputtering method, and a zirconium oxide film (insulation layer 52) was obtained by thermal oxidation.

By these processes, the vibrating plate 50 including a silicon dioxide film and a zirconium oxide film is manufactured.

Manufacturing of First Electrode Layer

On the vibrating plate 50 (on the zirconium oxide film (insulation layer 52)), a titanium layer, a platinum layer, an iridium layer, and a titanium layer were formed in this order by the sputtering method, and thereby manufacturing the first electrode layer 60. In Example 1, the titanium layer was formed as an adhesion layer for improving the adhesiveness between the layers or the films.

Manufacturing of Piezoelectric Layer (Underlayer)

On the first electrode layer 60, the above-described PZT precursor solution was coated by the spin coating method, and drying/degreasing was performed at 140° C. and 370° C., thereby manufacturing a degreasing film. A heating process was performed to the degreasing film at 737° C. using a rapid thermal annealing (RTA) device, thereby manufacturing the piezoelectric layer (underlayer) which is formed of the PZT.

Patterning of First Electrode Layer and Piezoelectric Layer (Under Layer)

A resist pattern having a predetermined shape was formed on the above-described piezoelectric layer (underlayer) by a photolithography and the first electrode layer 60 and the piezoelectric layer (underlayer) was subjected to patterning by the dry etching.

Manufacturing of Control Layer 4 nm of the titanium layer was formed on the piezoelectric layer (underlayer) and the vibrating plate 50 after patterning by the sputtering method. The titanium layer is a control layer for improving the orientation of the crystal of the piezoelectric layer (main layer) to be described.

Manufacturing of Piezoelectric Layer (Main Layer)

A coating/drying/degreasing was performed in twice under the same condition as that of the piezoelectric layer (underlayer) and heating process was performed by the RTA device under the same condition as that of the piezoelectric layer (underlayer). By performing these operations at four times, the piezoelectric layer (main layer) was formed on the titanium layer that is a control layer. According to this, in Example 1, the piezoelectric layer 70 including the piezoelectric layer (underlayer), the titanium layer, and the piezoelectric layer (main layer) was obtained.

Manufacturing of Lower Layer Side Electrode 20 nm of a platinum layer (lower layer side electrode 80a) is formed on the above-described piezoelectric layer 70 (the piezoelectric layer (main layer)) by the sputtering method. Next, the recovery anneal (RA) treatment was performed at 600° C. for 5 minutes by using the RTA device.

Patterning of Titanium Layer, Piezoelectric Layer (Main Layer), and Lower Layer Side Electrode The resist pattern having a predetermined shape was formed on the above-described platinum layer (lower layer side electrode 80a) by the photolithography and the titanium layer, the piezoelectric layer (main layer), and the platinum layer were subjected to patterning by the dry etching.

Manufacturing of Upper Layer Side Electrode 30 nm of an iridium layer (upper layer side electrode 80b) was formed on the platinum layer (lower layer side electrode 80a) by the patterning. Next, 15 nm of a titanium layer was formed on the iridium layer by the sputtering method. Accordingly, in Example 1, the second electrode layer 80 including the platinum layer, the titanium layer, and the iridium layer was obtained. The titanium layer is an adhesion layer for overlapping the lead wirings by gold or the like.

Patterning of Upper Layer Side Electrode and Titanium Layer

A resist pattern having a predetermined shape was formed on the above-described titanium layer by the photolithography and the iridium layer (upper layer side electrode 80b) and the titanium layer were subjected to the patterning by the dry etching.

In Example 1, by the above processes, the piezoelectric element 300 including the first electrode layer 60, the piezoelectric layer 70, and the second electrode layer which includes the platinum layer (lower layer side electrode 80a) and the iridium layer (upper layer side electrode 80b) was completed.

Formation of CAV Structure

A silicon dioxide film which was formed on a surface opposite to the piezoelectric element 300 by sandwiching the vibrating plate 50 therebetween of a silicon substrate (wafer 110) was removed by grinding process and the substrate was grinded and polished so as to make the thickness of the substrate to 400 μm. Next, a chrome (Cr) film having a predetermined shape was formed on the grinded surface, thereby manufacturing a Cr hard mask. In a state where the piezoelectric element 300 is subjected to a waterproof treatment, by immersing the substrate with an etching solution including KOH, a cavity (CAV) having a predetermined shape was formed on a surface opposite to the piezoelectric element 300 by sandwiching the vibrating plate 50 of the silicon substrate.

In Example 1, by the above processes, a device element A including the piezoelectric element 300 including the first electrode layer 60, the piezoelectric layer 70, and the second electrode layer 80 which includes the platinum layer (lower layer side electrode 80a) and the iridium layer (upper layer side electrode 80b) in which the CAV is further formed was obtained. Here, a device structure of the device element A is defined as "a", and an aspect ratio (a ratio of the X direction to the Y direction) of the moveable portion in the device structure a (a portion sandwiched by the first electrode layer 60 and the second electrode layer 80) was set to 1:25.

Example 2

In Example 2, by patterning formation which is different from Example 1, patterning of the first electrode layer 60, the piezoelectric layer 70, and the second electrode layer 80 was performed, and the piezoelectric element 300 including the first electrode layer 60, the piezoelectric layer 70, and the second electrode layer 80 which includes the platinum layer (lower layer side electrode 80a) and the iridium layer (upper layer side electrode 80b) was completed.

Thereafter, a silicon dioxide film which was formed on a surface opposite to the piezoelectric element 300 with the vibrating plate 50 therebetween of a silicon substrate (wafer 110) was removed by grinding process and the Si of the silicon substrate was grinded so as to make the thickness of the substrate to 150 μm, thereby forming the cavity (CAV) having a predetermined shape by the dry etching. Next, a metallic back plate was bonded to the grinded surface with the adhesive so as to cover the CAV. Next, the lens member 20 was bonded to the surface of the vibrating plate 50 side of the silicon substrate through the sound adjustment layer 13. Next, a terminal on the substrate (the first electrode layer 60 and the second electrode layer 80) and the terminal on an external circuit board in which a control circuit was provided were connected by a flexible cable, and a waterproof packaging was further performed by a plastic case, thereby obtaining a device B. Here, a device structure of the device element B was defined as "b", and an aspect ratio (a ratio of the X direction to the Y direction) of the functional portion in the device structure b (a portion sandwiched by the first electrode layer 60 and the second electrode layer 80) was set to 1:2.

Comparative Example 1

In Comparative Example 1, the device element was manufactured in the same manner as Example 1 except that the lower layer side electrode 80a in the second electrode layer 80 was set as 20 nm of the Pt layer and the upper layer side electrode 80b is set as 40 nm.

Comparative Example 2

In Comparative Example 2, the device element was manufactured in the same manner as Example 1 except that the lower layer side electrode 80a in the second electrode layer 80 was set as the electrode layer in which 5 nm of Ti layer was formed on the 4 nm of the Ir layer, and the RA treatment was performed at 740° C. for 7 minutes.

Comparative Example 3

In Comparative Example 3, the device element was manufactured in the same manner as Example 2 except that the lower layer side electrode 80a in the second electrode layer 80 was set as the electrode layer in which 5 nm of Ti layer was formed on the 4 nm of the Ir layer, and the RA treatment was performed at 740° C. for 7 minutes.

Comparative Example 4

In Comparative Example 4, the device element was manufactured in the same manner as Example 1 except that the lower layer side electrode 80a in the second electrode layer 80 was set as the electrode layer by forming 5 nm of the Ti layer on the 4 nm of the Ir layer and performing the RA treatment at 740° C. for 7 minutes, and the upper layer side electrode 80b was set as 20 nm of the Pt layer.

Example 3

In Example 3, the device element was manufactured in the same manner as Example 1 except that a PMN-PT precursor solution was used instead of the PZT precursor solution and the manufacturing condition of the piezoelectric layer was different to Example 1. That was, the device element of Example 3 has the device structure a in which the main layer in the piezoelectric layer 70 is formed of the PMN-PT.

Preparation of PMN-PT Precursor Solution

The PMN-PT precursor solution was manufactured as follows. Firstly, 2-butoxyethanol and dimethyl amino ethanol are weighted to a container, thereby manufacturing a mixed solution. Next, titanium tetra-i-propoxide and niobupenta-n-butoxide were weighted in a glove box which was filled with dry nitrogen, and the resultant was mixed with the mixed solution. Thereafter, after sufficiently stirring the mixed solution at a room temperature, magnesium acetate and lead acetate were weighted under the atmosphere, and a mixing/stirring was performed at the room temperature, thereby manufacturing the PMN-PT precursor solution.

Manufacturing of Piezoelectric Layer (Underlayer A)

On the first electrode layer 60, the above-described PZT precursor solution was coated by the spin coating method, and drying/degreasing was performed at 140° C. and 370° C., thereby manufacturing a degreasing film. A heating process was performed to the degreasing film at 737° C. using a rapid thermal annealing (RTA) device, thereby manufacturing the piezoelectric layer (underlayer A) which is formed of the PZT.

Patterning of First Electrode Layer and Piezoelectric Layer (Underlayer A)

A resist pattern having a predetermined shape was formed on the above-described piezoelectric layer (underlayer A) by a photolithography and the first electrode layer 60 and the piezoelectric layer (underlayer A) were subjected to patterning by the dry etching.

Manufacturing of Control Layer 4 nm of the titanium layer was formed on the piezoelectric layer (underlayer A) and the vibrating plate 50 after patterning by the sputtering method. The titanium layer is a control layer for improving the orientation of the crystal of the piezoelectric layer (main layer) to be described.

Manufacturing of Piezoelectric Layer (Underlayer B)

A coating/drying/degreasing was performed under the same condition as that of the piezoelectric layer (under layer A), a heating process by the RTA device was performed under the same condition as that of the piezoelectric layer (underlayer A), and a piezoelectric layer (underlayer B) was formed on the above-described titanium layer.

Manufacturing of Piezoelectric Layer (Main Layer)

On the piezoelectric layer (underlayer B), the above-described PMN-PT precursor solution was coated by the spin coating method, and drying/degreasing was performed at 180° C. and 350° C., thereby manufacturing a degreasing film. A heating process was performed to the degreasing film at 750° C. using a rapid thermal annealing (RTA) device, thereby manufacturing the piezoelectric film which is formed of the PMN-PT. By repeating the manufacturing process of the piezoelectric film in 6 times, the piezoelectric layer (the main layer) was formed on the piezoelectric layer (underlayer B). According to this, in Example 1, the piezoelectric layer including the piezoelectric layer (underlayer A), the titanium layer, the piezoelectric layer (underlayer B), and the piezoelectric layer (main layer) was obtained.

Example 4

In Example 4, the device element was manufactured in the same manner as Example 2 except that the manufacturing condition of the piezoelectric layer was the same as that of Example 3. That is, the device element of Example 4 has the device structure b in which the main layer in the piezoelectric layer 70 is formed of the PMN-PT.

Comparative Example 5

In Comparative Example 5, the device element was manufactured in the same manner as Comparative Example 1 except that the manufacturing condition of the piezoelectric layer was the same as that of Example 3.

Comparative Example 6

In Comparative Example 6, the device element was manufactured in the same manner as Comparative Example 2 except that the manufacturing condition of the piezoelectric layer was the same as that of Example 3.

Comparative Example 7

In Comparative Example 7, the device element was manufactured in the same manner as Comparative Example 3 except that the manufacturing condition of the piezoelectric layer was the same as that of Example 3.

Evaluation Content
Shape Observation

An appearance configuration (presence or absence of the appearance abnormal such as laminate state, disconnection, peeling, or the like) of Examples 1 to 4 and Comparative Examples 1 to 7 was observed by an optical microscope and a scanning electron microscope (SEM). As a result, in the device element of Comparative Example 4, the peeling in the second electrode layer 80 was confirmed, and other than the device element, the special appearance abnormal which affects the properties was not observed.

P-E Loop Measurement

Figure 15:
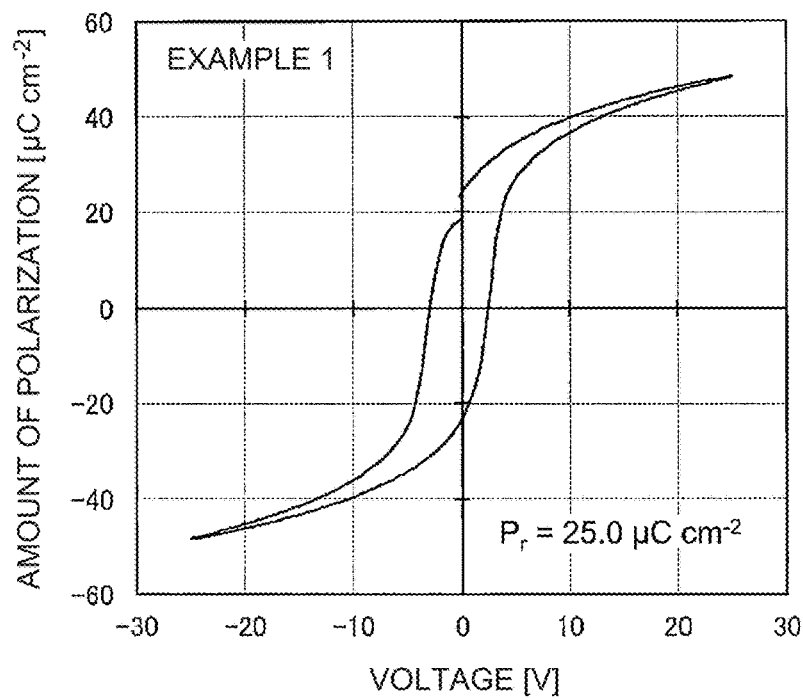
FIG. 15 illustrates a measurement result of a P-E loop of Example 1.
Figure 16:
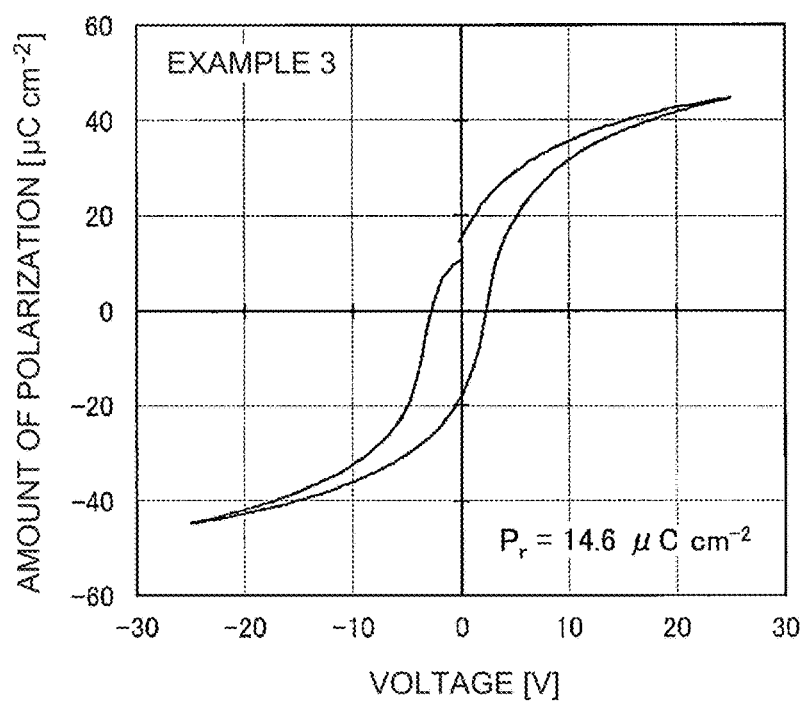
FIG. 16 illustrates a measurement result of a P-E loop of Example 3.
Figure 17:
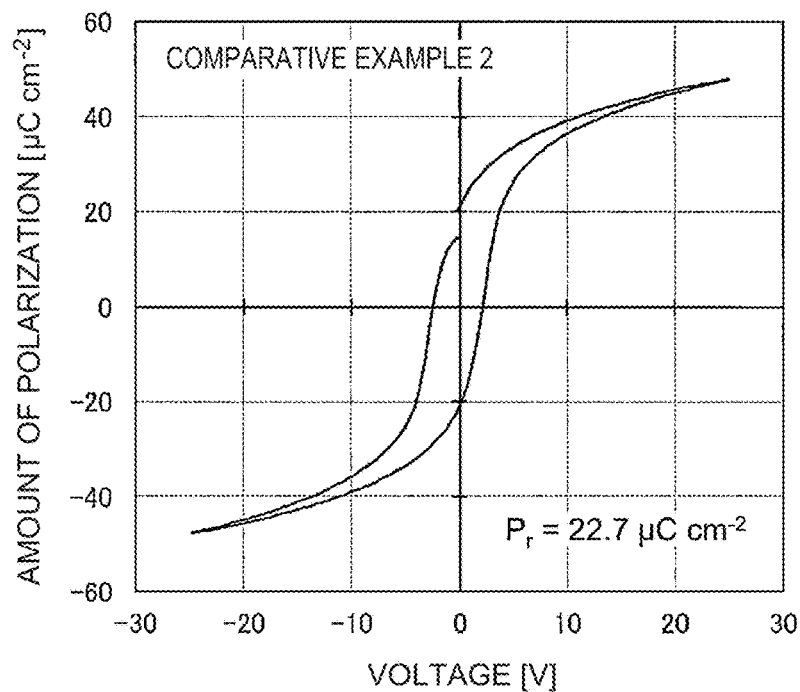
FIG. 17 illustrates a measurement result of a P-E loop of Comparative Example 2.
Figure 18:
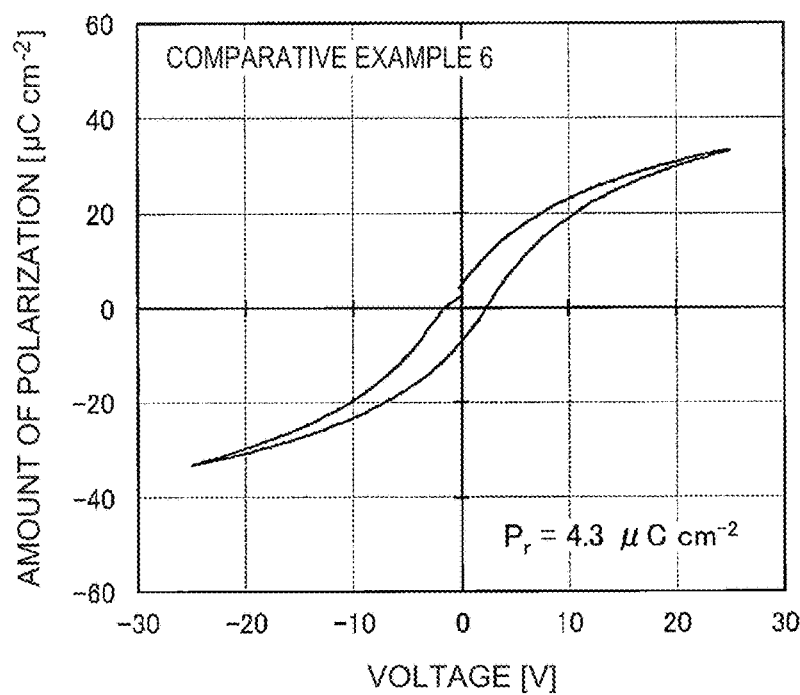
FIG. 18 illustrates a measurement result of a P-E loop of Comparative Example 6.

Regarding Examples 1 and 3 and Comparative Examples 2 and 6, a triangular wave having a frequency of 1 kHz was applied at room temperature by using φ=500 μm of an electrode pattern and a relationship (P-E loop) between a polarization amount P (μC cm$^2$) and a voltage E (V) was obtained through "FCE-1A" manufactured by TOYO corporation. FIG. 15 illustrates a P-E loop in which Example 1 was measured at ±25 V. In the same manner, FIG. 16 illustrates a measurement result of Example 3, FIG. 17 illustrates a measurement result of Comparative Example 2, and FIG. 18 illustrates a measurement result of Comparative Example 6, respectively. In addition, a residual amount of polarization Pr (μC cm$^{-2}$) which was obtained by the measurement result of each P-E loop is shown in Table 1.

As shown in Table 1, in Example 1 using the Pt as the lower layer side electrode 80a of the second electrode layer 80, the residual amount of polarization Pr is 25 μC cm$^{-2}$. With respect to this, in Comparative Example 2 using Ti/Ir as the lower layer side electrode 80a, the residual amount of the polarization Pr is 22.7 μC cm$^{-2}$. That is, in Example 1, the residual amount of polarization Pr is increased by about 10% compared to Comparative Example 2.

In addition, as shown in Table 1, in Example 3 using the Pt as the lower layer side electrode 80a of the second electrode layer 80, the residual amount of polarization Pr is 14.6 μC cm$^{-2}$. With respect to this, in Comparative Example 6 using the Ti/Ir as the lower layer side electrode 80a, the residual amount of polarization Pr is 4.3 μC cm$^{-2}$. That is, in Example 3, the residual amount of polarization Pr is increased about 3 times compared to Comparative Example 6.

From the above description, it is clear that by using the Pt to the lower layer side electrode 80a, the ferroelectricity of the device element can be improved. In addition, it is clear that an improvement effect of the ferroelectricity can receive the full benefit regardless of the electronic structure.

Initial Deflection Measurement

Figure 19:
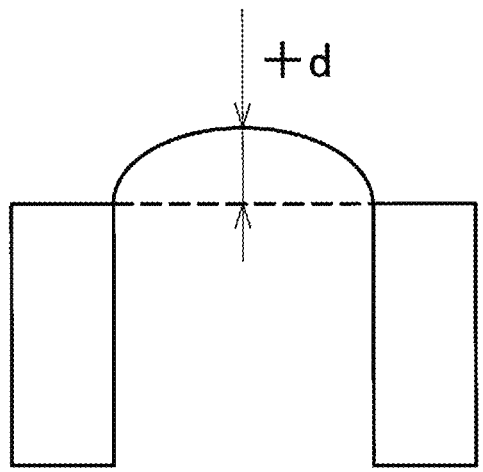
FIG. 19 is a schematic diagram illustrating a convex deflection of a device element.
Figure 20:
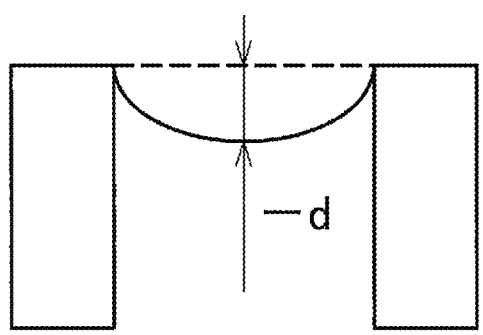
FIG. 20 is a schematic diagram illustrating a concave deflection of a device element.

Regarding Examples 1 to 4 and Comparative Examples 1 to 7, a deflection amount (initial deflection amount) in a non-voltage applied state was measured through an optical interferometric surface roughness measuring system "NT9300DMEMS" manufactured by Veeco Instruments Inc. In FIG. 19, a schematic diagram of a state where the shape is deflected in a convex shape with respect to the CAV (space 12) of the device element (hereinafter, referred to as a "convex deflection") is shown and in FIG. 20, a schematic diagram of a state where the shape is deflected in a concave shape with respect to the CAV (space 12) of the device element (hereinafter, referred to as a "concave deflection") is shown. In addition, each of the initial deflection measurement results is shown in Table 1. In Table 1, a case of no deflection is indicated as zero, an initial deflection amount d of a case of the convex deflection (refer to FIG. 19) is indicated as +d, and the initial deflection amount d of a case of the concave deflection (refer to FIG. 20) is indicated as −d.

As shown in Table 1, in Comparative Example 2 using the Ti/Ir to the both of the lower layer side electrode 80a and the upper layer side electrode 80b of the second electrode layer 80, it becomes the convex deflection having the initial deflection amount d of +11 nm. That is, in Comparative Example 2, since the Ir mainly applies the tensile stress in in-plane direction with respect to the piezoelectric element 300 and the vibrating plate 50, and the balance between a compressive stress to be applied to the vibrating plate 50 by the piezoelectric element 300 can be established, it becomes +11 nm of the convex deflection.

On the other hand, in Comparative Example 1 in which the Pt is used for the lower layer side electrode 80a and the upper layer side electrode 80b is not formed, it becomes the concave deflection having the initial deflection amount d of −214 nm. That is, in Comparative Example 1, since in-plane stress to be applied to the piezoelectric element 300 and the vibrating plate 50 by the Pt is small, and the compressive stress to be applied to the vibrating plate 50 by the piezoelectric element 300 is dominant, it becomes −214 nm of the concave deflection.

With respect to this, in Example 1 using the Pt to the lower layer side electrode 80a and using the Ti/Ir to the upper layer side electrode 80b, the initial deflection amount d becomes 0 nm, and an initial deflection position is greatly improved with respect to Comparative Example 1.

In addition, as shown in Table 1, in Comparative Example 6 using the Ti/Ir to both of the lower layer side electrode 80a and the upper layer side electrode 80b of the second electrode layer 80, it becomes an concave deflection having the initial deflection amount d of −57 nm. That is, in Comparative Example 6, since the Ir mainly applies the tensile stress in in-plane direction with respect to the piezoelectric element 300 and the vibrating plate 50, and the balance between a compressive stress to be applied to the vibrating plate 50 by the piezoelectric element 300 can be established, it becomes −57 nm of the concave deflection.

On the other hand, in Comparative Example 5 in which the Pt is used for the lower layer side electrode 80a and the upper layer side electrode 80b is not formed, it becomes the concave deflection having the initial deflection amount d of −159 nm. That is, in Comparative Example 5, since in-plane stress to be applied to the piezoelectric element 300 and the vibrating plate 50 by the Pt is small, and the compressive stress to be applied to the vibrating plate 50 by the piezoelectric element 300 is dominant, it becomes −159 nm of the concave deflection.

With respect to this, in Example 3 using the Pt to the lower layer side electrode 80a and using the Ti/Ir to the upper layer side electrode 80b, it becomes the concave deflection having the initial deflection amount d of −76 nm, and an initial deflection position is greatly improved with respect to Comparative Example 5.

From the above-described results, it is clear that by setting the upper layer side electrode 80b as the Ti/Ir without any change of the Pt which is used as the lower layer side electrode 80a, the initial deflection is greatly improved. In addition, it is clear that an improvement effect of the initial deflection can receive the full benefit regardless of the electronic structure. In addition, as described above, Ti of the upper layer side electrode 80b is the adhesion layer for overlapping the lead wirings by Au or the like. The formation of Ti has no negative effects on the tensile stress of the Ir.

In addition, by the problem of the pattern shape, the initial deflection amounts d of Examples 2 and 4 and Comparative Examples 3 and 7 cannot be measured. However, it is found that by observing the appearance, it becomes the deflection shape that Example 2 is follows Example 1, Example 4 is follows Example 3, Comparative Example 3 is follows Comparative Example 2, and Comparative Example 7 is follows Comparative Example 6.

Transmitting and Receiving Properties

Figure 21:
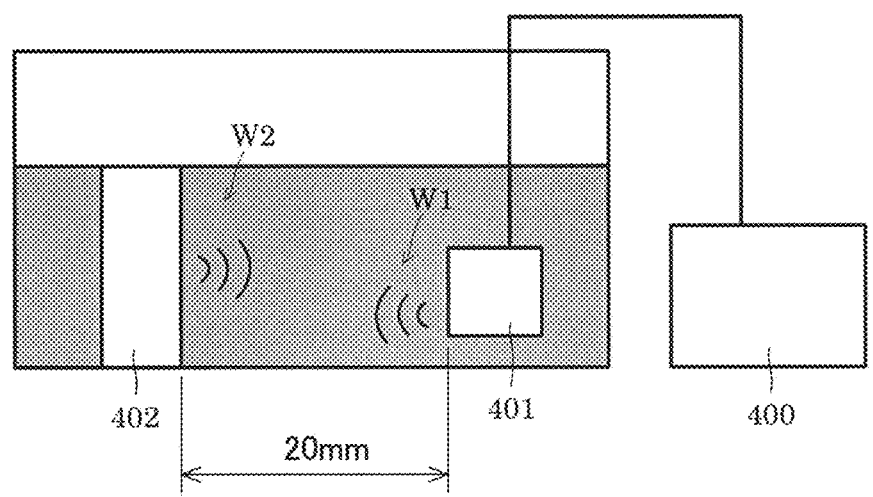
FIG. 21 is an explanatory diagram of an evaluation method of transmitting and receiving properties.

In FIG. 21, a diagram for illustrating an evaluation method of the transmitting and receiving properties is illustrated. As illustrated in FIG. 21, the transmitting and receiving properties were measured using an evaluation machine 400, an ultrasonic element 401, and an SUS plate 402. In Examples 1 and 2 and Comparative Examples 1 to 4, an evaluation of 6 MHz of the transmitting and receiving properties in water was performed, and in Examples 3 and 4 and Comparative Examples 5 to 8, an evaluation of 5.5 MHz of the transmitting and receiving properties in the water was performed.

Here, the transmitting and receiving properties are properties of the receiving voltage generated when a longitudinal wave W1 which is sent by inserting ±6 V of waveform under a DC 10 V by the ultrasonic element 401 inserted into the water is reflected to a SUS plate (SUS plate 402) which is mounted ahead of 20 mm and a reflected wave W2 is received by the same element (ultrasonic element 401).

Figure 22:
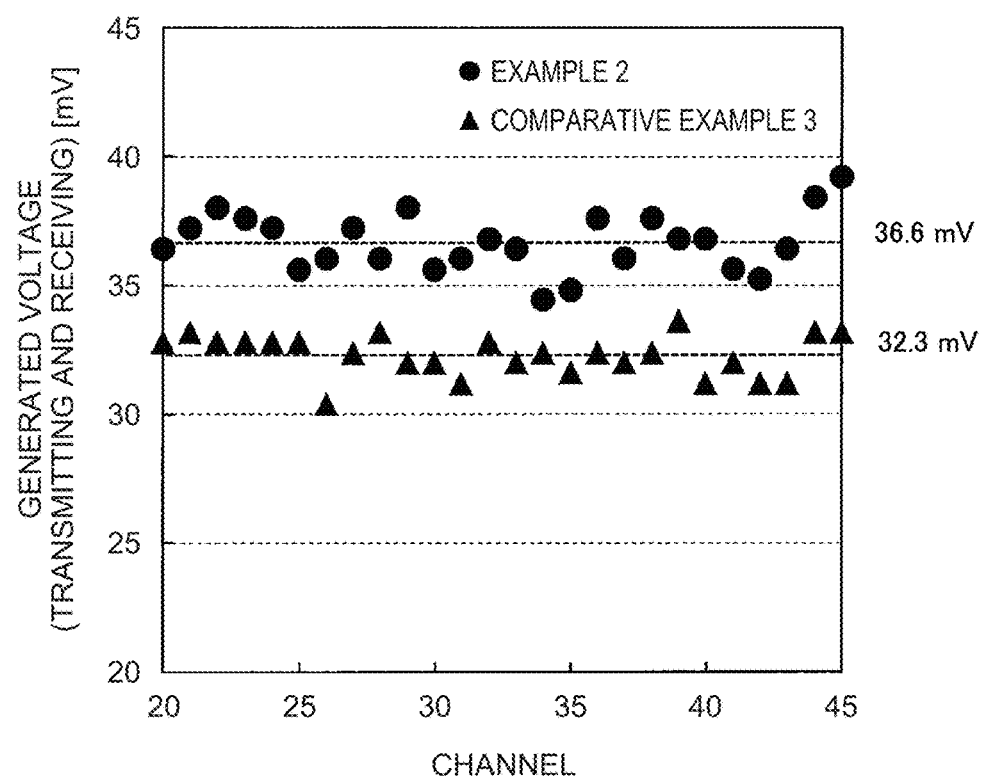
FIG. 22 illustrates a measurement result of transmitting and receiving properties of Example 2 and Comparative Example 3.
Figure 23:
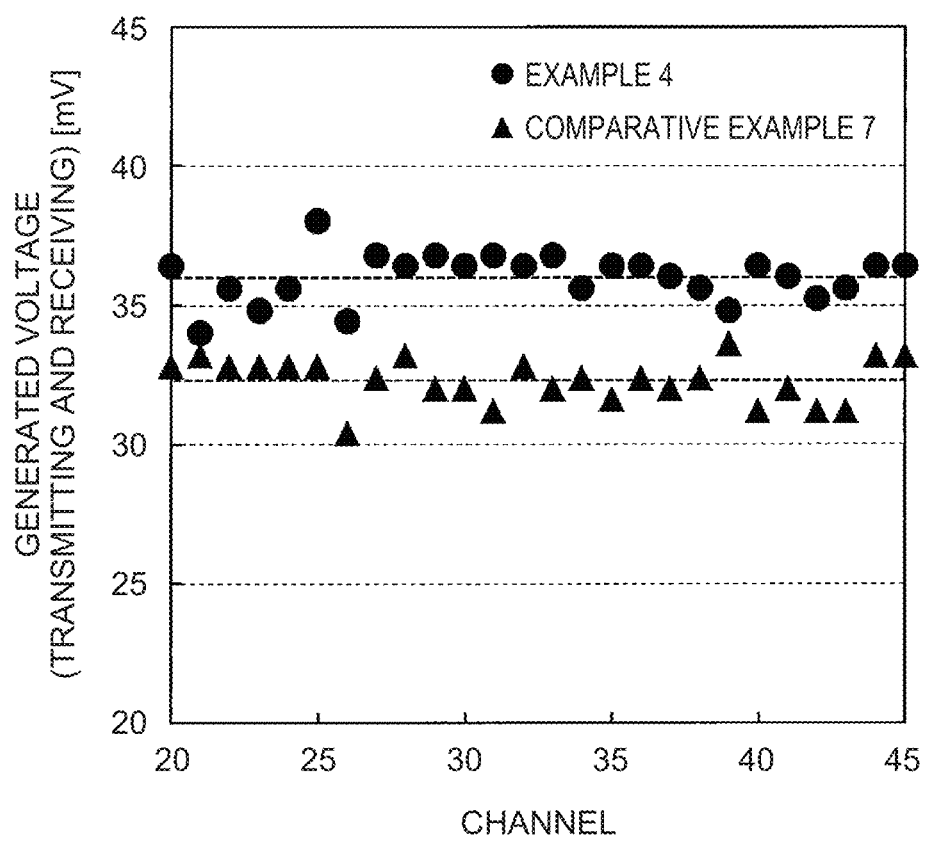
FIG. 23 illustrates a measurement result of transmitting and receiving properties of Example 4 and Comparative Example 7.

In FIG. 22, transmitting and receiving voltages of Example 2 and Example 3 are illustrated, and in FIG. 23, transmitting and receiving voltages of Example 4 and Example 7 are illustrated. As illustrated in FIG. 22, the transmitting and receiving voltage of Comparative Example 3 using the Ti/Ir to the lower layer side electrode 80a is 32.3 mV. With respect to this, the transmitting and receiving voltage of Example 2 using the Pt to the lower layer side electrode 80a is 36.6 mV, and it is clear that the voltage is improved by about 13%. In the same manner, as illustrated in FIG. 23, in compared to Comparative Example 7 in which the Ti/Ir is used for the lower layer side electrode 80a, it is clear that the transmitting and receiving voltage of Example 4 using the Pt to the lower layer side electrode 80a is largely improved and good transmission and reception sensitivity is exhibited.

From the result, it is clear that a configuration of the devices of Examples 2 and 4 in which the ferroelectricity is improved by using the Pt to the lower layer side electrode 80a, and the initial deflection is improved by using the Ti/Ir to the upper layer side electrode 80b and which is provided so as to extend to the outside of the piezoelectric element 300 and the space 12 (cavity) across the X and Y directions is appropriate to the ultrasonic device.

Relationship Between Deflection Shape and Transmitting and Receiving Properties

Figure 24:
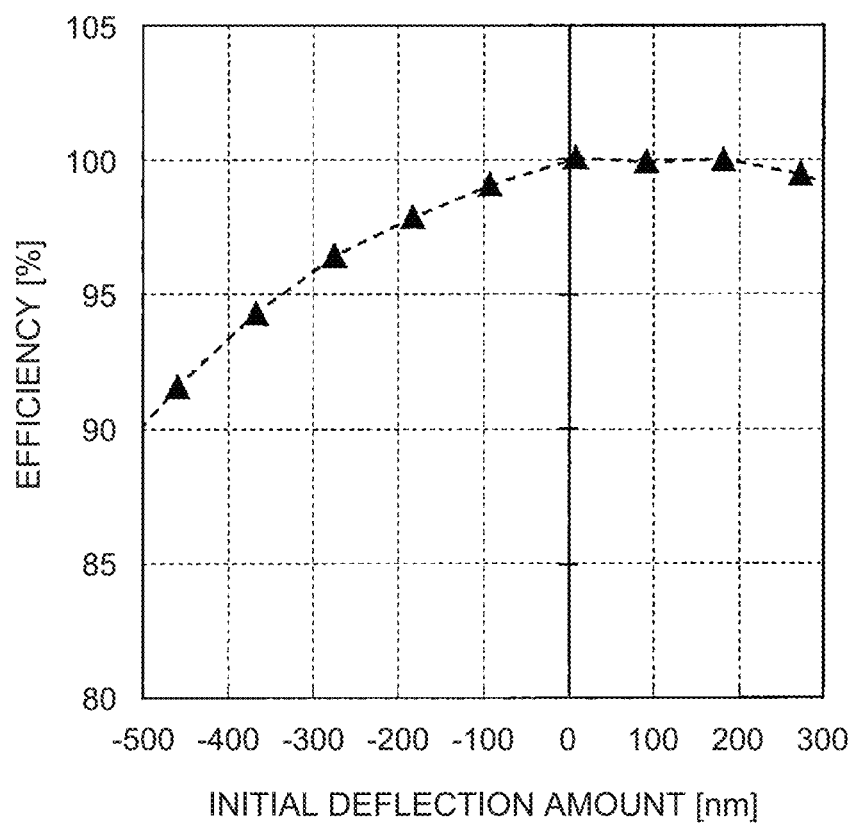
FIG. 24 illustrates a simulation result of a relationship between a deflection shape and the transmitting and receiving properties.

In FIG. 24, a relationship between the deflection shape and the transmitting and receiving properties which is calculated by the simulation is illustrated. As illustrated in FIG. 24, in a range of the initial deflection amount d of 0 nm to +200 nm, there is almost no effect on the transmitting and receiving sensitivity. With respect to this, it is found that in a case where the initial deflection amount d is less than 0 nm, the transmitting and receiving sensitivity is deteriorated according to the amount. That is, in comparison of Example 2 that is a configuration of the second electrode layer 80 as the same manner of Example 1 and Comparative Example 3 that is a configuration as the same manner of Comparative Example 2, it is clear that it is not required for considering the difference between the initial deflections.

In addition, in Example 2 and Comparative Example 3, the initial deflection amount could not be measured. However, in the P-E loop measurement, when it is considered that in Example 1 corresponding to Example 2, the residual amount of polarization Pr is improved by 10% as compared to Comparative Example 2 corresponding to Comparative Example 3, the reason of the improve in the transmitting and receiving sensitivity in Example 2 by 13% is that the residual amount of polarization Pr is improved as compared to Example 3.

Furthermore, as shown in Comparative Example 1, in a case where the Pt is used for the lower layer side electrode 80a and the upper layer side electrode 80b is not formed, as shown in Table 1, since the initial deflection amount d is −214 nm, it is found from FIG. 24 that negative effects was caused by the tensile stress.

Accordingly, by setting the lower layer side electrode 80a as the Pt, and setting the upper layer side electrode 80b as the Ti/Ir, it is clear that the negative effect caused by that the initial deflection is concaved can be avoided.

TABLE 1

| | Device Structure | Piezoelectric Layer (Main layer) | Second Electrode Layer (Lower layer side electrode) | (Upper layer side electrode) | Peeling | Initial Deflection | Initial Deflection Amount d nm | Residual Amount of Polarization Pr μC cm$^{-2}$ |
|---|---|---|---|---|---|---|---|---|
| Example 1 | a | PZT | Pt | Ti/Ir | Absence | None | 0 | 25 |
| Example 2 | b | | Pt | Ti/Ir | Absence | None | — | — |
| Comparative Example 1 | a | | Pt | — | Absence | Concave | −214 | — |
| Comparative Example 2 | a | | Ti/Ir | Ti/Ir | Absence | Convex | +11 | 22.7 |
| Comparative Example 3 | b | | Ti/Ir | Ti/Ir | Absence | Convex | — | — |
| Comparative Example 4 | a | | Ti/Ir | Pt | Present | — | — | — |
| Example 3 | a | PMN-PT | Pt | Ti/Ir | Absence | Concave | −76 | 14.6 |
| Example 4 | b | | Pt | Ti/Ir | Absence | Concave | — | — |
| Comparative Example 5 | a | | Pt | — | Absence | Concave | −159 | — |
| Comparative Example 6 | a | | Ti/Ir | Ti/Ir | Absence | Concave | −57 | 4.3 |
| Comparative Example 7 | b | | Ti/Ir | Ti/Ir | Absence | Concave | — | — |

As described above, according to the piezoelectric element 300 of Examples 1 to 4, the residual amount of polarization is increased by contacting the Pt layer that is the lower layer side electrode 80*a* with the piezoelectric layer 70, thereby improving the ferroelectricity. Furthermore, the initial deflection to the CAV surface side of the vibrating plate 50 is suppressed by the tensile stress of the Ir of the Ti/Ir layer that is the upper layer side electrode 80*b* which is provided so as to extend to the outside of the piezoelectric element 300 and the space 12 (cavity) across the X and Y directions, thereby improving the deformation efficiency. As a result, it is clear that the piezoelectric element 300 of Examples 1 to 4 is the ultrasonic device with excellent receiving properties.

Other Embodiments

In the above-described embodiments, a lens structure having a type (so-called CAV surface type) in which the side opposite to the piezoelectric element of the vibrating plate is set as the passing area of the ultrasonic waves is applied. However, the structure is not limited thereto. For example, the lens structure having a type (so-called ACT surface type) in which the piezoelectric element side of the vibrating plate is set as the passing area of the ultrasonic waves may be applied depending on the application.

In addition to the above-described present embodiment, an ultrasonic measurement device can be configured by equipping the piezoelectric element 300 according to the invention and a control unit for measuring the detection object by using the signal based on at least one of the ultrasonic wave which is sent by the piezoelectric element 300 and the ultrasonic waves which is received by the piezoelectric element 300.

Such an ultrasonic measurement device obtains information relating to a position, a shape, a speed, or the like of the measurement object based a time from a time point in which the ultrasonic waves is sent to the time point in which the echo signals in which the sent ultrasonic waves are reflected to the measurement object and are returned, and the piezoelectric element 300 is used as an element for generating the ultrasonic waves or an element for sensing the echo signals.

If the piezoelectric element 300 according to the invention which obtains the improvement in the piezoelectric constant is used as an ultrasonic generating element or an echo signal sensor, the ultrasonic measurement device with the improved ultrasonic generating efficiency or echo signal sensing efficiency can be provided.

Although not described in the above-described present embodiment, for example, it can provide a configuration in which a side opposite to the piezoelectric element 300 of the vibrating plate 50 is set as the passing area of the ultrasonic waves which are sent toward the measurement object or the ultrasonic waves (echo signals) which are reflected from the measurement object. According to this, a configuration of a side opposite to the piezoelectric element 300 of the vibrating plate 50 can be simplified and the good passing area of the ultrasonic waves can be maintained. In addition, an electrical region of an electrode, a wiring, or the like, or an adhesion fixed region of each portion is apart from the measurement object. Accordingly, contamination or leakage current between these regions and the measurement objects can be easily prevented. Accordingly, the invention can also be appropriately applied to a medical instrument which specifically resent the contamination or the leakage current, for example, an ultrasound diagnostic device, a hemopiezometer, and an ophthalmotonometer.

In addition, although not described in the above-described present embodiment, it is preferable that a sealing plate for sealing a region including the piezoelectric element 300 is bonded to the substrate 10. According to this, since the piezoelectric element 300 can be physically protected, and strength of the ultrasonic sensor 1 is increased, it is possible to improve the structure stability. Furthermore, in a case where the piezoelectric element 300 is configured as a thin film, handling properties of the ultrasonic sensor 1 including the piezoelectric element 300 can be improved.

In the present embodiment, the space 12 is illustrated as an example in which the space 12 is formed for each piezoelectric element 300. However, it is not limited thereto, and the space 12 may be formed in accordance with the plurality of piezoelectric elements 300. For example, the spaces 12 which are in common to the row of the piezoelectric elements 300 that are arranged along the scan direction, or one space 12 may be entirely formed. In a case where the spaces 12 which are common to plurality of piezoelectric elements 300 are provided, the vibrating states of the piezoelectric element 300 are different. However, by providing the member for pressing between the piezoelectric elements 300 from the side opposite to the substrate 10 of the vibrating plate 50 and the same vibrating as that of the case where the separated space 12 is provided may be performed.

Figure 25:
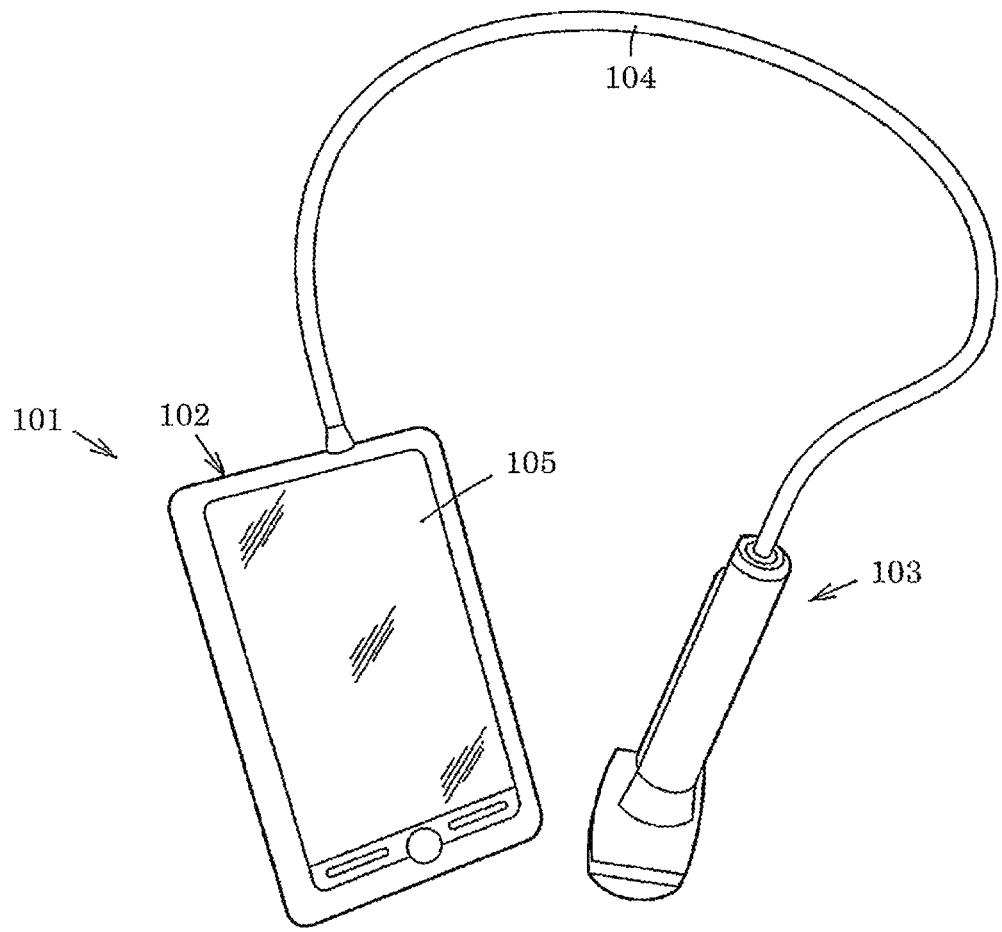
FIG. 25 is a perspective view illustrating an example of an ultrasonic diagnosis device.

Here, an example of an ultrasonic diagnosis device using the above-described ultrasonic sensor will be described. FIG. 25 is a perspective view illustrating a schematic configuration of an example of the ultrasonic diagnosis device and FIG. 26 is a side view of the ultrasonic probe.

As illustrated in the drawing, an ultrasonic diagnosis device 101 includes a device terminal 102 and an ultrasonic probe (probe) 103. The device terminal 102 and the ultrasonic probe 103 are connected to each other by a cable 104. Electrical signals are received and transmitted between the device terminal 102 and the ultrasonic probe 103 through the cable 104. A display panel (display device) 105 is assembled in the device terminal 102. A screen of the display panel 105 is exposed to the surface of the device terminal 102. An image based on the ultrasonic waves which are transmitted from the ultrasonic sensor 1 of the ultrasonic probe 103 and detected is generated in the device terminal 102. The imaged detection result is displayed on the screen of the display panel 105.

Figure 26:
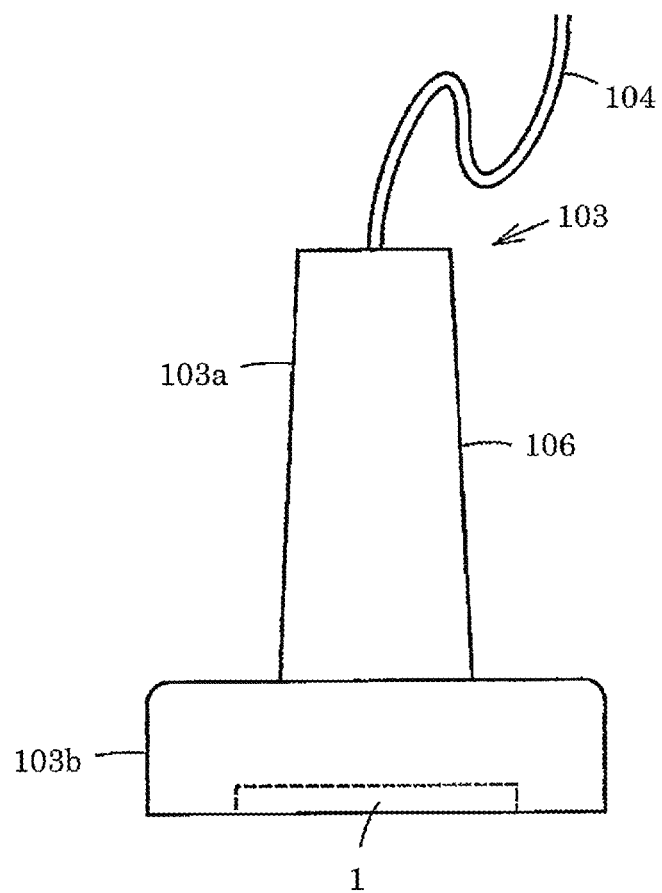
FIG. 26 is a front view illustrating an example of an ultrasonic probe.

As illustrated in FIG. 26, the ultrasonic probe 103 includes a housing 106. The ultrasonic sensor 1 in which a plurality of ultrasonic sensor elements 310 (refer to FIG. 2) are arranged two dimensionally in the X direction and the Y direction is stored in the housing 106. The ultrasonic sensor 1 is provided such that the surface of the ultrasonic sensor 1 is exposed to the surface of the housing 106. The ultrasonic sensor 1 outputs the ultrasonic waves from the surface and receives the reflected waves of the ultrasonic waves. In addition, the ultrasonic probe 103 can include a probe head 103b which is detachable to a probe main body 103a. In this case, the ultrasonic sensor 1 can be assembled into the housing 106 of the probe head 103b. The ultrasonic sensor 1 is configured such that the ultrasonic sensor elements 310 are arranged two dimensionally in the X direction and the Y direction.

The entire disclosure of Japanese Patent Application No. 2015-246728, filed on Dec. 17, 2015 is expressly incorporated by reference herein.

What is claimed is:

1. A piezoelectric device for an ultrasonic sensor comprising:
    a substrate with a cavity;
    a vibrating plate which is provided on the substrate so as to block an opening surface of the cavity;
    a piezoelectric element which is provided on a surface of the vibrating plate opposite to the cavity, including a first electrode, a piezoelectric layer which is provided on the first electrode, and a second electrode which is provided on the piezoelectric layer,
    wherein the second electrode has a laminated structure including a platinum layer and a first iridium layer,
    the platinum layer is in contact with the piezoelectric layer,
    if it is assumed that two directions which are parallel to a surface of the substrate and mutually perpendicular are defined as an X direction and a Y direction, the first iridium layer is extended to an outside of the piezoelectric element and the cavity at least in the X direction on an X-Y plane view,
    a second iridium layer is extended to the outside of the piezoelectric element and the cavity in the Y direction on the X-Y plane view, and
    the second iridium layer is separated from the first iridium layer, on the piezoelectric layer.

2. The piezoelectric device for an ultrasonic sensor according to claim 1,
    wherein the piezoelectric layer is present in the cavity, and
    wherein the platinum layer is present only on the piezoelectric layer in the X direction.

3. The piezoelectric device for an ultrasonic sensor according to claim 1,
    wherein the piezoelectric layer is present in the cavity, and
    wherein the second iridium layer is extended from both end portions on the piezoelectric layer to the outside of the cavity in the Y direction, and a second platinum layer which is separated from the platinum layer is present between the both end portions of the piezoelectric layer and the second iridium layer.

* * * * *